(12) United States Patent
Tsukude

(10) Patent No.: US 7,447,098 B2
(45) Date of Patent: Nov. 4, 2008

(54) SEMICONDUCTOR MEMORY DEVICE HAVING COMPLETE HIDDEN REFRESH FUNCTION

(75) Inventor: Masaki Tsukude, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/976,354

(22) Filed: Oct. 24, 2007

(65) Prior Publication Data

US 2008/0062776 A1    Mar. 13, 2008

Related U.S. Application Data

(63) Continuation of application No. 11/375,079, filed on Mar. 15, 2006, now Pat. No. 7,301,843.

(30) Foreign Application Priority Data

Mar. 15, 2005   (JP)  ............................. 2005-072314
Feb. 14, 2006   (JP)  ............................. 2006-036729

(51) Int. Cl.
    *G11C 7/00*     (2006.01)

(52) U.S. Cl. .................................. 365/222; 365/230.06

(58) Field of Classification Search ................. 365/222, 365/230.06, 230.03
See application file for complete search history.

(56) References Cited

U.S. PATENT DOCUMENTS

| 5,831,921 | A | | 11/1998 | Tsukude | |
|---|---|---|---|---|---|
| 5,835,401 | A | * | 11/1998 | Green et al. | ................ 365/149 |
| 6,005,818 | A | * | 12/1999 | Ferrant | ........................ 365/222 |
| 6,697,910 | B2 | | 2/2004 | Tsukude et al. | |
| 6,757,784 | B2 | * | 6/2004 | Lu et al. | ...................... 711/118 |
| 6,813,211 | B2 | * | 11/2004 | Takatsuka et al. | ........... 365/222 |
| 6,859,415 | B2 | | 2/2005 | Takatsuka et al. | |

FOREIGN PATENT DOCUMENTS

| JP | 9-161477 A | 6/1997 |
|---|---|---|
| JP | 2002-352577 A | 12/2002 |

* cited by examiner

*Primary Examiner*—Anh Phung
(74) *Attorney, Agent, or Firm*—McDermott Will & Emery LLP

(57) ABSTRACT

In a DRAM having a complete hidden refresh function, when data refresh is to be carried out in an active mode, a signal for selecting a way is set to an "H" level and then reset to an "L" level at each cycle while the corresponding upper address is designated. When data refresh is to be carried out in a standby mode, the signal for selecting the way is maintained at an "H" level and is not reset to an "L" level while the corresponding upper address is designated. This can reduce the standby current.

2 Claims, 21 Drawing Sheets

TIME t →

SEMICONDUCTOR MEMORY DEVICE HAVING COMPLETE HIDDEN REFRESH FUNCTION

This application is a Continuation of U.S. application Ser. No. 11/357,079, filed Mar. 15, 2006, now U.S. Pat. No. 7,301,843, issued on Nov. 27, 2007, claiming priority of Japanese Application Nos. 2005-072314, filed Mar. 15, 2005, and 2006-036729, filed Feb. 14, 2006, the entire contents of each of which are hereby incorporated by reference.

BACKGROUND OF THE INVENTION

1. Field of the Invention

The present invention relates to a semiconductor memory device, and particularly to a semiconductor memory device having a complete hidden refresh function for performing data refresh without being externally instructed.

2. Description of the Background Art

In the field of portable terminals such as portable telephones, an asynchronous general-purpose static semiconductor memory device (hereinafter, referred to as "SRAM") for which external clocks need not be supplied is widely used. Since the SRAM does not require data refresh, complex control is unnecessary. For example, it is unnecessary to control such that an access to the memory is awaited until a refresh cycle is finished. For this reason, the use of the SRAM can simplify the system configuration, and therefore, the SRAM is suitable for use with the portable terminal.

Recently, the function of the portable terminal has been improved significantly, and the terminal requires a large-capacity memory. The SRAM however has a memory cell size that is about 10 times that of a dynamic semiconductor memory device (hereinafter, referred to as "DRAM"). When a large-capacity SRAM is used, the cost for the memory chip is significantly increased, and consequently, the price of the portable terminal is increased. To overcome the problem, a new technical scheme was conceived in which, instead of the SRAM, a DRAM lower in cost per unit bit is used for the portable terminal.

The DRAM however requires complex memory control for the refresh operation. For portable-terminal manufacturers that hitherto have been engaged in design of systems using SRAMs as memories, it is not easy to use DRAMs as substitutive memories of SRAMs. Under these circumstances, many semiconductor manufacturers have begun the development of a new semiconductor memory device that is formed of a DRAM but operates as an SRAM in terms of external functions In this new semiconductor memory device, the same memory cells as those used in the DRAM are used. On the other hand, external interfaces, such as control signals and address signals to be input to the semiconductor memory device, are the same as those to be input to the SRAM. However, different from the refresh operation or the self-refresh operation of the conventional DRAM, the refresh operation of the new semiconductor memory device is not controlled by signals received from an external source. Rather, the refresh operation is controlled by a refresh instruction signal /REFE that is periodically output from a refresh circuit provided in the semiconductor memory device (for example, see Japanese Patent Laying-Open No. 2002-352577). The new semiconductor memory device capable of such completely hidden refresh will be hereinafter referred to as a "complete hidden refresh function-equipped DRAM".

The development of the complete hidden refresh function-equipped DRAM offers support to improved functions of the portable terminals.

There is also proposed a DRAM reduced in power consumption, wherein in a self-refresh mode, an upper address is assigned to each of ways (word line groups) and a lower address is assigned to each word line belonging to each of the ways, and while one way is selected, the way selection signal for selecting the way is maintained at an active level to prevent reset of the signal to an inactive level (for example, see Japanese Patent Laying-Open No. 09-161477).

In the complete hidden refresh function-equipped DRAM as well, it is important to reduce power consumption, since it is used for a portable terminal.

With the complete hidden refresh function-equipped DRAM, however, data refresh is carried out in response to refresh instruction signal /REFE even in the active mode. This means that the read/write operation and the refresh operation co-exist in the active mode, making it impossible to fix the way selection signal to an active level. Further, the way selection signal is reset to an inactive level every time a lower address is changed even in the standby mode, for the purpose of matching with the active mode. This increases the consumed current.

SUMMARY OF THE INVENTION

In view of the foregoing, a main object of the present invention is to provide a semiconductor memory device having a complete hidden refresh function and reduced in power consumption.

A semiconductor memory device according to the present invention is a semiconductor memory device having a complete hidden refresh function for performing data refresh without being externally instructed, which includes: a memory cell array having a plurality of memory cells arranged in rows and columns, a plurality of word lines provided corresponding to the respective rows, and a plurality of bit line pairs provided corresponding to the respective columns, the word lines being divided into a plurality of word line groups; an oscillator for outputting a clock signal having a predetermined first period; a group selection circuit operative in synchronization with the clock signal, and for sequentially selecting the plurality of word line groups at a second period that is a multiple of the first period, the group selection circuit setting a group selection signal indicating the selected word line group to an active level and then resetting the same to an inactive level at the first period in an active mode where data read/write can be performed, and setting the group selection signal to an active level and then resetting the same to an inactive level at the second period in a standby mode where data is retained; a word line selection circuit for sequentially selecting a plurality of word lines belonging to the word line group selected by the group selection circuit at the first period, the word line selection circuit setting a word line selection signal indicating the selected word line to an active level and then resetting the same to an inactive level at the first period; a word driver provided corresponding to each word line, and for setting the corresponding word line to a selected level when both of the corresponding group selection signal and the corresponding word line selection signal are set to the active level; and a refresh executing circuit for carrying out data refresh of each memory cell corresponding to the word line set to the selected level by the word driver.

Accordingly, during the period in which one word line group is selected in the standby mode, the group selection signal is maintained at an active level, without being reset to an inactive level. This can reduce power consumption compared to the conventional case where the group selection signal would be reset to an inactive level every time a word line is selected.

Another semiconductor memory device according to the present invention is a semiconductor memory device having a complete hidden refresh function for performing data refresh without being externally instructed, which includes: a memory cell array divided into a plurality of memory blocks, each memory block having a plurality of memory cells arranged in rows and columns, a plurality of word lines provided corresponding to the respective rows, and a plurality of bit line pairs provided corresponding to the respective columns; an oscillator for outputting a clock signal having a predetermined first period; a word line selection circuit operative in synchronization with the clock signal, and for sequentially selecting the plurality of word lines at a second period that is a multiple of the first period, the word line selection circuit setting a word line selection signal indicating the selected word line to an active level and then resetting the same to an inactive level at the first period in an active mode where data read/write can be performed, and setting the word line selection signal to an active level and then resetting the same to an inactive level at the second period in a standby mode where data is retained; a block selection circuit for sequentially selecting the plurality of memory blocks at the first period, the block selection circuit setting a block selection signal indicating the selected memory block to an active level and then resetting the same to an inactive level at the first period; a word driver provided corresponding to each word line, and for setting the corresponding word line to a selected level when both of the corresponding word line selection signal and the corresponding block selection signal are set to the active level; and a refresh executing circuit for carrying out data refresh of each memory cell corresponding to the word line set to the selected level by the word driver.

Accordingly, during the period in which one word line is selected in the standby mode, the word line selection signal is maintained at an active level, without being reset to an inactive level. Therefore, power consumption is reduced compared to the conventional case where the word line selection signal would be reset to an inactive level every time a memory block is selected.

Yet another semiconductor memory device according to the present invention is a semiconductor memory device having a complete hidden refresh function for performing data refresh without being externally instructed, which includes: a memory cell array divided into a plurality of memory blocks, each memory block having a plurality of memory cells arranged in rows and columns, a plurality of word lines provided corresponding to the respective rows, and a plurality of bit line pairs provided corresponding to the respective columns; a refresh executing circuit provided between every two of the plurality of memory blocks, and for carrying out data refresh of each memory cell corresponding to a word line set to a selected level in the adjacent memory blocks; an oscillator for outputting a clock signal having a predetermined first period; a block selection circuit operative in synchronization with the clock signal, and for sequentially selecting the plurality of memory blocks at a second period that is a multiple of the first period, the block selection circuit setting a block selection signal indicating the selected memory block to an active level and then resetting the same to an inactive level at the first period in an active mode where data read/write can be performed, and setting the block selection signal to an active level and then resetting the same to an inactive level at the second period in a standby mode where data is retained; a word line selection circuit for sequentially selecting a plurality of word lines belonging to the memory block selected by the block selection circuit at the first period, the word line selection circuit setting a word line selection signal indicating the selected word line to an active level and then resetting the same to an inactive level at the first period; a connection circuit provided corresponding to each memory block, and for connecting the corresponding memory block to the corresponding refresh executing circuit and disconnecting the other memory block from the relevant refresh executing circuit while the corresponding block selection signal is at the active level; and a word driver provided corresponding to each word line, and for setting the corresponding word line to a selected level when both of the corresponding block selection signal and the corresponding word line selection signal are set to the active level.

Accordingly, during the period in which one memory block is selected in the standby mode, the block selection signal is maintained at an active level, without being reset to an inactive level, This can reduce power consumption compared to the conventional case where the block selection signal is reset to an inactive level every time a word line is selected.

As described above, according to the present invention, it is possible to reduce consumed power of a semiconductor memory device having a complete hidden refresh function.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
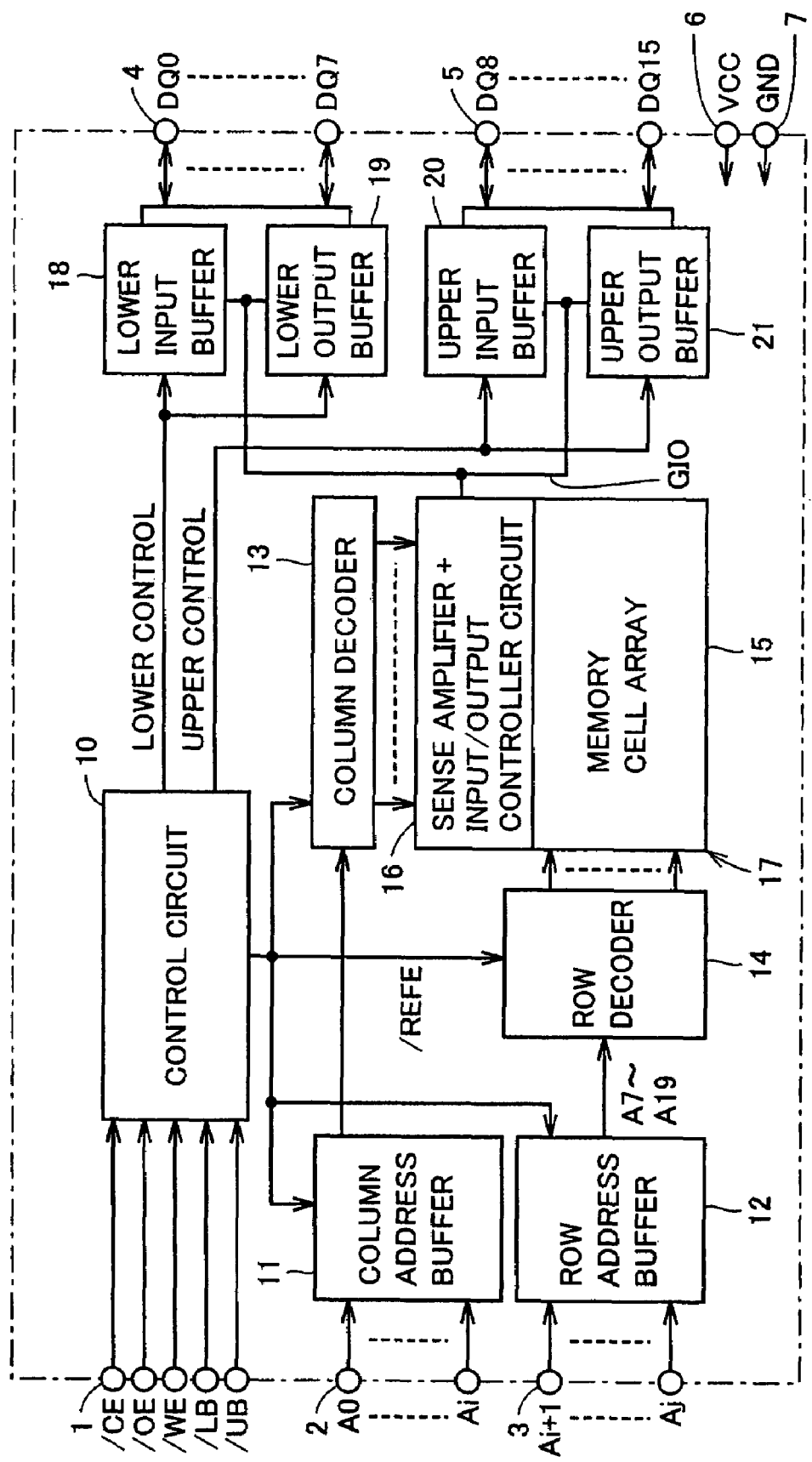
FIG. 1 is a block diagram showing an overall configuration of a complete hidden refresh function-equipped DRAM according to a first embodiment of the present invention.

FIG. 1 is a block diagram showing an overall configuration of a complete hidden refresh function-equipped DRAM according to a first embodiment of the present invention. In FIG. 1, this complete hidden refresh function-equipped DRAM includes a control signal input terminal group 1, a column address input terminal group 2, a row address input terminal group 3, a lower data input/output terminal group 4, an upper data input/output terminal group 5, a power supply terminal 6, and a ground terminal 7. Control signal input terminal group 1 receives a chip enable signal /CE, an output enable signal /OE, a write enable signal /WE, and control signals /LB and /UB. Column address input terminal group 2 receives column address signals A0-Ai (i is an integer not lower than 0). Row address input terminal group 3 receives row address signals Ai+1 to Aj (j is a natural number). Lower data input/output terminal group 4 allows lower data signals DQ0-DQ7 to be input/output therethrough. Upper data input/output terminal group 5 allows upper data signals DQ8-DQ15 to be input/output therethrough. Power supply terminal 6 receives a power supply potential VCC. Ground terminal 7 receives aground potential GND.

Chip enable signal /CE sets the complete hidden refresh function-equipped. DRAM to an active mode. Output enable signal /OE sets the complete hidden refresh function-equipped DRAM to a read mode and concurrently activates an output buffer. Write enable signal /WE sets the complete hidden refresh function-equipped DRAM to a write mode. Control signal /LB selects an operation of inputting/outputting lower data signals DQ0-DQ7. Control signal /UB selects an operation of inputting/outputting upper data signals DQ8-DQ15.

The complete hidden refresh function-equipped DRAM further includes a control circuit 10, a column address buffer 11, and a row address buffer 12. Control circuit 10 generates various internal control signals according to control signals /CE, /OE, . . . externally provided via control signal input terminal group 1, and sets the complete hidden refresh function-equipped DRAM to a prescribed operation mode such as a write mode, a read mode, or a refresh mode. Column address buffer 11 receives column address signals A0-Ai externally provided via column address input terminal group 2, and transfers them to the inside. Row address buffer 12 receives row address signals Ai+1 to Aj externally provided via row address input terminal group 3, and transfers them to the inside.

The complete hidden refresh function-equipped DRAM further includes a column decoder 13, a row decoder 14, a memory cell array 15, and a sense amplifier+input/output controller circuit 16. Column decoder 13 specifies a column address according to column address signals A0-Ai provided from column address buffer 11. Row decoder 14 specifies a row address according to row address signals Ai+1 to Aj provided from row address buffer 12. Row decoder 14 also generates an internal row address signal in response to a refresh instruction signal /REFE from control circuit 10, and specifies a row address according to the generated internal row address signal. Memory cell array 15 includes a plurality of memory cells arranged in rows and columns. Sense amplifier+input/output controller circuit 16 performs data refresh of the memory cells, data write to the memory cells, and data read from the memory cells. Memory cell array 15 and sense amplifier+input/output controller circuit 16 constitute a memory mat 17.

The complete hidden refresh function-equipped DRAM further includes a lower input buffer 18, a lower output buffer 19, an upper input buffer 20, and an upper output buffer 21. Lower input buffer 18 receives lower write data signals D0-D7 via lower data input/output terminal group 4, and transfers them to sense amplifier+input/output controller circuit 16. Lower output buffer 19 receives lower read data signals Q0-Q7 from sense amplifier+input/output controller circuit 16, and outputs them to lower data input/output terminal group 4. Upper input buffer 20 receives upper write data signals D8-D15 via upper data input/output terminal group 5, and transfers them to sense amplifier+input/output controller circuit 16. Upper output buffer 21 receives upper read data signals Q8-Q15 from sense amplifier+input/output controller circuit 16, and outputs them to upper data input/output terminal group 5. Sense amplifier+input/output controller circuit 16 and buffers 18-21 are connected via a global signal input/output line pair group GIO.

Figure 2:
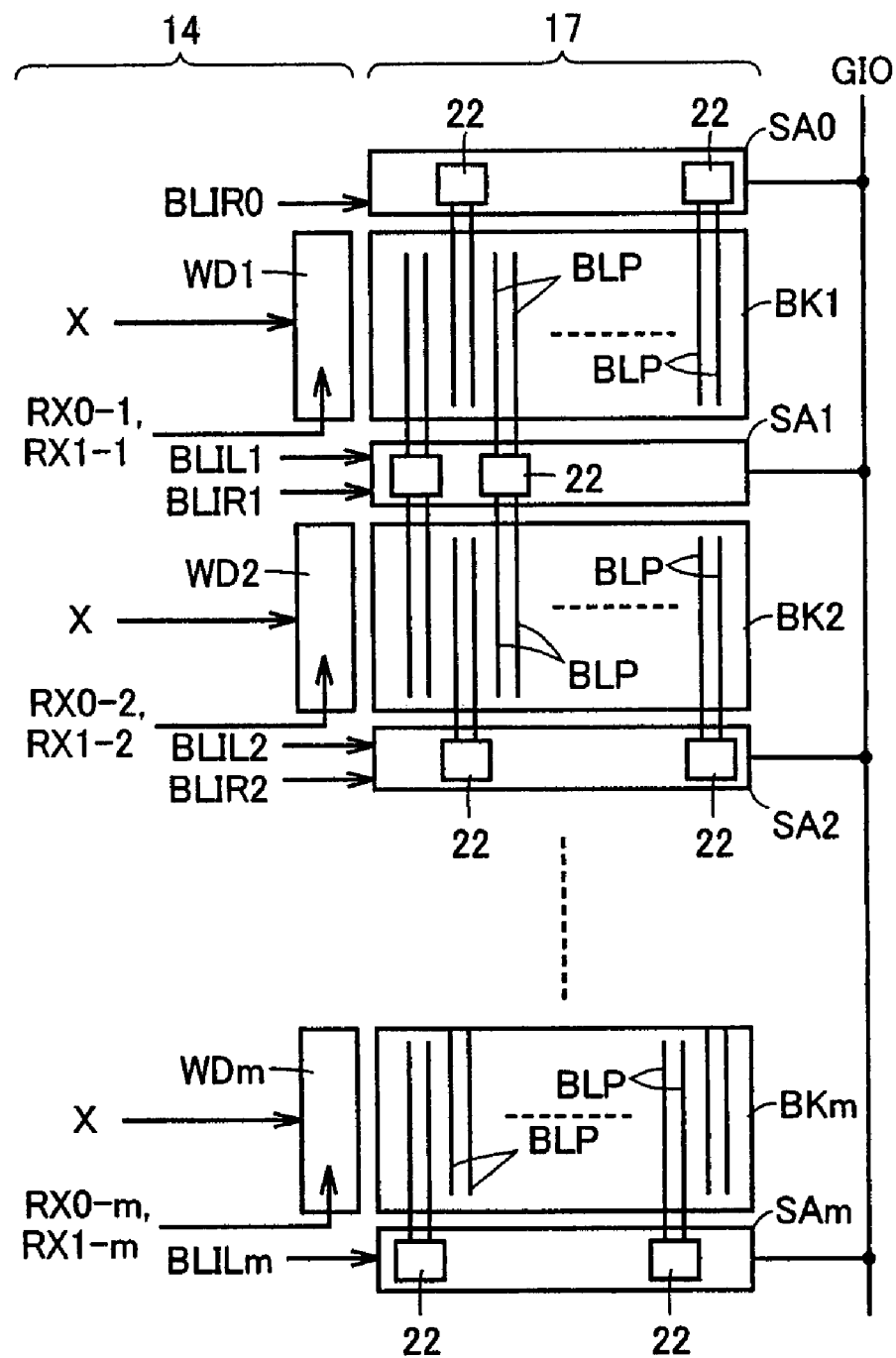
FIG. 2 is a block diagram showing layout of a row decoder and a memory mat shown in FIG. 1.

FIG. 2 is a diagram showing layout of row decoder 14 and memory mat 17 shown in FIG. 1. Referring to FIG. 2, this complete hidden refresh function-equipped DRAM uses a so-called alternate shared sense amplifier method. More specifically, memory array 15 is divided into a plurality of memory blocks BK1-BKm (m is an integer of 2 or greater), sense amplifier+input/output controller circuit 16 is divided into a plurality of sense amplifier bands SA0-SAm, and memory blocks BK1-BKm are respectively located between every two of sense amplifier bands SA0-SAm.

Sense amplifier band SA0 is provided with a plurality of sense amplifiers 22 corresponding, for example, to even columns of adjacent memory block BK1. Sense amplifier band SA1 is provided with a plurality of sense amplifiers 22 corresponding, e.g., to odd columns of adjacent memory blocks BK1 and BK2. Sense amplifiers 22 of sense amplifier band SA1 are shared by memory blocks BK1 and BK2. Determination as to which sense amplifier 22 of sense amplifier band SA1 is to be used by which one of memory blocks BK1 and BK2 is made based on signals BLIL1 and BLIR1 input from row decoder 14. Other sense amplifier bands SA2-SAm each have a similar configuration.

Row decoder 14 includes a plurality of word driver groups WD1-WDm. Word drivers WD1-WDm are provided corresponding to memory blocks BK1-BKm, respectively. Word driver group WD1 selects one row of memory block BK1 in response to a signal group X and signals RX0-1 and RX1-1. Signals BLIL1, BLIR1, signal group X, and signals RX0-1, RX1-1 are generated in row decoder 14 based on row address signals Ai+1 to Aj and others. Other word driver groups WD2-WDm each have a similar configuration.

Figure 3:
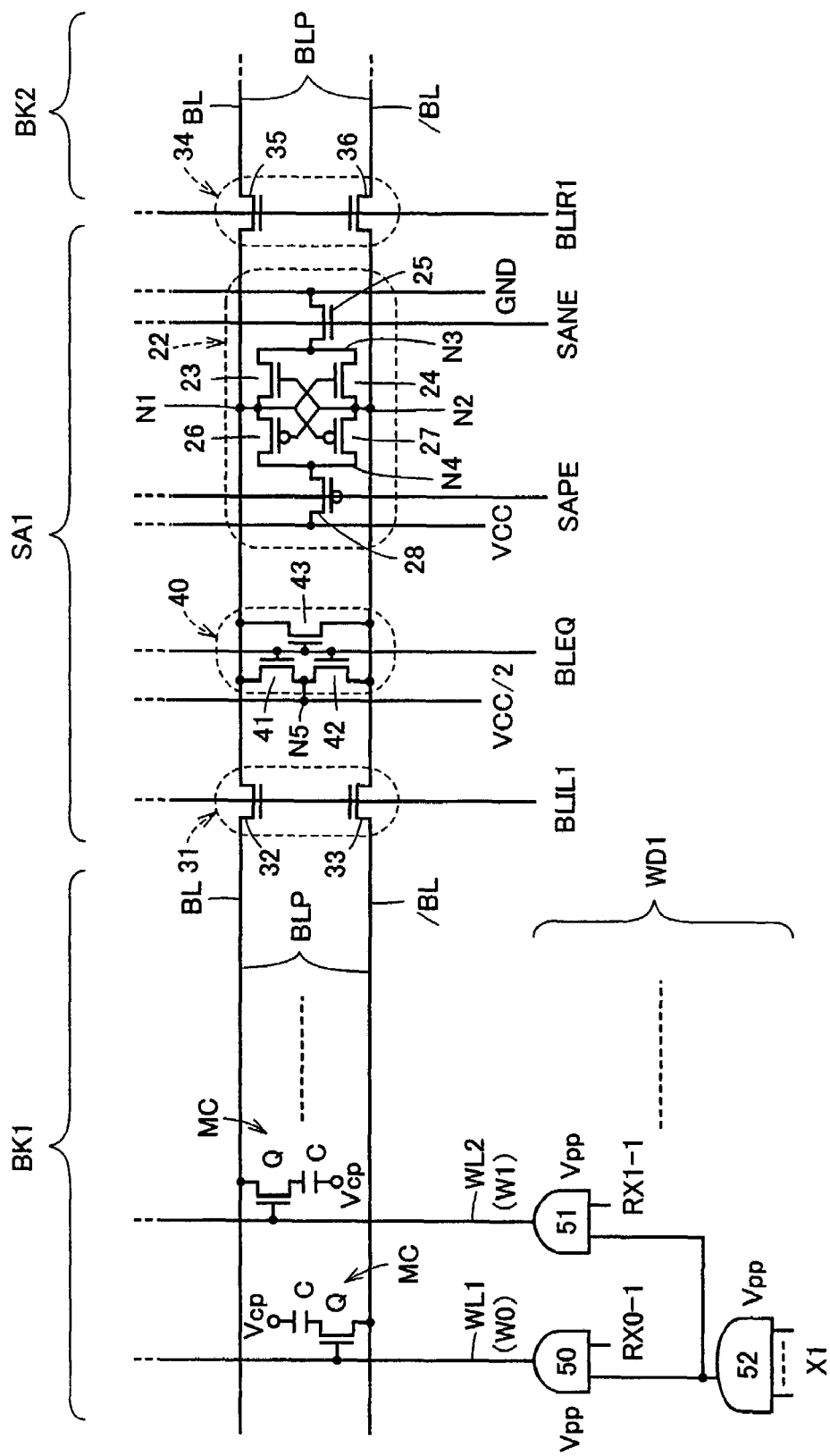
FIG. 3 is a circuit diagram showing details of a main part of FIG. 2.

FIG. 3 is a circuit block diagram partially showing a structure of memory block BK1 of FIG. 2 and the periphery thereof. Referring to FIG. 3, memory block BK1 includes a plurality of memory cells MCs arranged in rows and columns, a plurality of word lines WLs provided corresponding to the respective rows, and a plurality of bit line pairs BLP provided corresponding to the respective columns. Memory cell MC includes an access MOS transistor Q and an information storage capacitor C. Word line WL transmits an output of word driver group WD1 and activates memory cell MC in a selected row. Bit line pair BLP includes bit lines BL and /BL through which complementary signals are transmitted, and inputs and outputs a data signal to and from a selected memory cell MC.

Bit line pair BLP in an odd column of memory block BK1 is connected via a transfer gate 31 to sense amplifier 22, and is further connected via a transfer gate 34 to bit line pair BLP in an odd column of memory block BK2. Transfer gate 31 includes N channel MOS transistors 32 and 33 that are respectively connected between bit lines BL, /BL and input/output nodes N1, N2 of sense amplifier 22. N channel MOS transistors 32 and 33 have their gates receiving a signal BLIL1. Transfer gate 34 includes N channel MOS transistors 35 and 36 that are respectively connected between bit lines BL, /BL and input/output nodes N1, N2 of sense amplifier 22. N channel MOS transistors 35 and 36 have their gates receiving a signal BLIR1. Transfer gates 31 and 34 connect a selected memory block (BK1, for example) out of memory blocks BK1 and BK2 to sense amplifier 22, and disconnect the other memory block (BK2; in this case) from sense amplifier 22.

Sense amplifier 22 includes N channel MOS transistors 23 and 24 connected between input/output nodes N1, N2 and a node N3, respectively, and P channel MOS transistors 26 and 27 connected between input/output nodes N1, N2 and a node N4, respectively. MOS transistors 23 and 26 have their gates connected to input/output node N2, and MOS transistors 24 and 27 have their gates connected to input/output node N1. Further, sense amplifier 22 includes an N channel MOS transistor 25 connected between node N3 and a node of ground potential GND, and a P channel MOS transistor 28 connected between node N4 and a node of power supply potential VCC. MOS transistors 25 and 28 have their gates receiving sense amplifier activation signals SANE and SAPE, respectively. Sense amplifier 22 amplifies a small potential difference produced between bit lines BL and /BL after activation of a memory cell MC, to power supply voltage VCC.

Furthermore, a bit line equalize circuit 40 for equalizing bit lines BL, /BL to a bit line precharge potential VCC/2 before activation of memory cell MC is provided between transfer gates 31 and 34. Bit line equalize circuit 40 includes N channel MOS transistors 41 and 42 connected between input/output nodes N1, N2 and a node N5, respectively, and an N channel MOS transistor 43 connected between input/output nodes N1 and N2. MOS transistors 41-43 have their gates receiving a bit line equalize signal BLEQ. Bit line precharge potential VCC/2 is applied to node N5.

This complete hidden refresh function-equipped DRAM employs a 2-way method as well. A plurality of word lines WLs in memory block BK1 are divided into two ways W0 and W1. Way W0 includes a word line WL in an odd row, and way W1 includes a word line WL in an even row. Signals RX0-1 and RX1-1 are assigned to Ways W0 and W1, respectively, of memory block BK1, and signal group X is assigned to respective word lines WLs belonging to ways W0 and W1. Respective word lines WLs of memory block BK1 are specified by signals RX0-1 and RX1-1 and signal group X.

In order to realize this 2-way method, word driver group WD1 includes a word driver (AND gate) 50 provided corresponding to each odd row of memory block BK1, a word driver (AND gate) 51 provided corresponding to each even row thereof, and a word driver (AND gate) 52 provided corresponding to each pair of adjacent word drivers 50 and 51. Word driver 52 receives a signal group X1. Word driver 50 receives an output of word driver 52 and signal RX0-1. Word driver 51 receives an output of word driver 52 and signal RX1-1. Outputs of word drivers 50 and 51 are respectively applied to corresponding word lines WLs. For example, if all signals of signal group X1 attain an active level of an "H" level (boosted potential Vpp) and signal RX0-1 for selecting way W0 attains an active level of an "H" level (boosted potential Vpp), the first word line WL1 is set to a selected level of an "H" level (boosted potential Vpp). The same applies to other memory blocks BK2-BKm. It is noted that word drivers 50-52 may be formed of CMOS transistors or N channel MOS transistors. Word drivers 50-52 are driven by boosted potential Vpp and ground potential GND.

Hereinafter, an operation of the complete hidden refresh function-equipped DRAM shown in FIGS. 1-3 will be described briefly. In the write mode, bit line pair BLP in the column corresponding to column address signals A0-Ai is selected by column decoder 13. Selected bit line pair BLP is connected to input buffers 18 and 20 via sense amplifier+input/output controller circuit 16 and global signal input/output line pair group GIO. Input buffers 18 and 20, in response to signal /WE, apply the write data signals from data input/output terminal groups 4 and 5 to the selected bit line pair BLP via global signal input/output line pair group GIO. The write data is provided as a potential difference between bit lines BL and /BL. Thereafter, row decoder 14 causes word line WL in the row corresponding to row address signals Ai+1 to Aj to rise to a selected level of an "H" level for a prescribed time, to render the MOS transistor Q of memory cell MC in the relevant row conductive. Charges corresponding to the potential of bit line BL or /BL are stored in capacitor C of the selected memory cell MC.

Charges in capacitor C of memory cell MC flow out gradually, so that data refresh is carried out. In the case where the internal row address signal generated in row decoder 14 is a signal for designating a word line WL in memory block BK1, in FIG. 3, signals BLIR1 and BLEQ fall from an "H" level to an "L" level, and MOS transistors 35 and 36 of transfer gate 34 and MOS transistors 41-43 of bit line equalize circuit 40 are rendered nonconductive. Row decoder 14 causes word line WL in the row corresponding to the relevant internal address signal to rise to an "H" level. The potentials of bit lines BL and /BL change slightly according to the amount of charges in capacitor C of the activated memory cell MC.

Next, sense amplifier activation signal SANE is pulled up to an "H" level, and sense amplifier activation signal SAPE is pulled down to an "L" level, whereby sense amplifier 22 is activated. If the potential of bit line BL is slightly higher than that of bit line /BL, the resistance values of MOS transistors 24 and 26 are lower than the resistance values of MOS transistors 23 and 27, and the potential of bit line BL is pulled up to an "H" level, and the potential of bit line /BL is pulled down to an "L" level. Conversely, if the potential of bit line /BL is slightly higher than that of bit line BL, the resistance values of MOS transistors 23 and 27 are smaller than the resistance values of MOS transistors 24 and 26. The potential of bit line /BL is pulled up to an "H" level, and the potential of bit line BL is pulled down to an "L" level. Word line WL is pulled down to a non-selected level of an "L" level, signals BLIR1, BLEQ, SANE and SAPE are reset, and thus, data refresh (rewrite) for the relevant word line WL is completed. The above-described cycle is carried out for each word line WL of memory block BK1, and then carried out for each word line WL of memory block BK2.

In the read mode, data of memory cells MCs in the row selected by row decoder 14 are read onto bit line pairs BLPs in a similar manner as in the refresh mode, and data in bit line pair BLP in the column selected by column decoder 13 is provided to output buffers 19 and 21 via global signal input/output line pair group GIO. Output buffers 19 and 21 output read data Q to data input/output terminal groups 4 and 5 in response to signal /OE.

Figure 4:
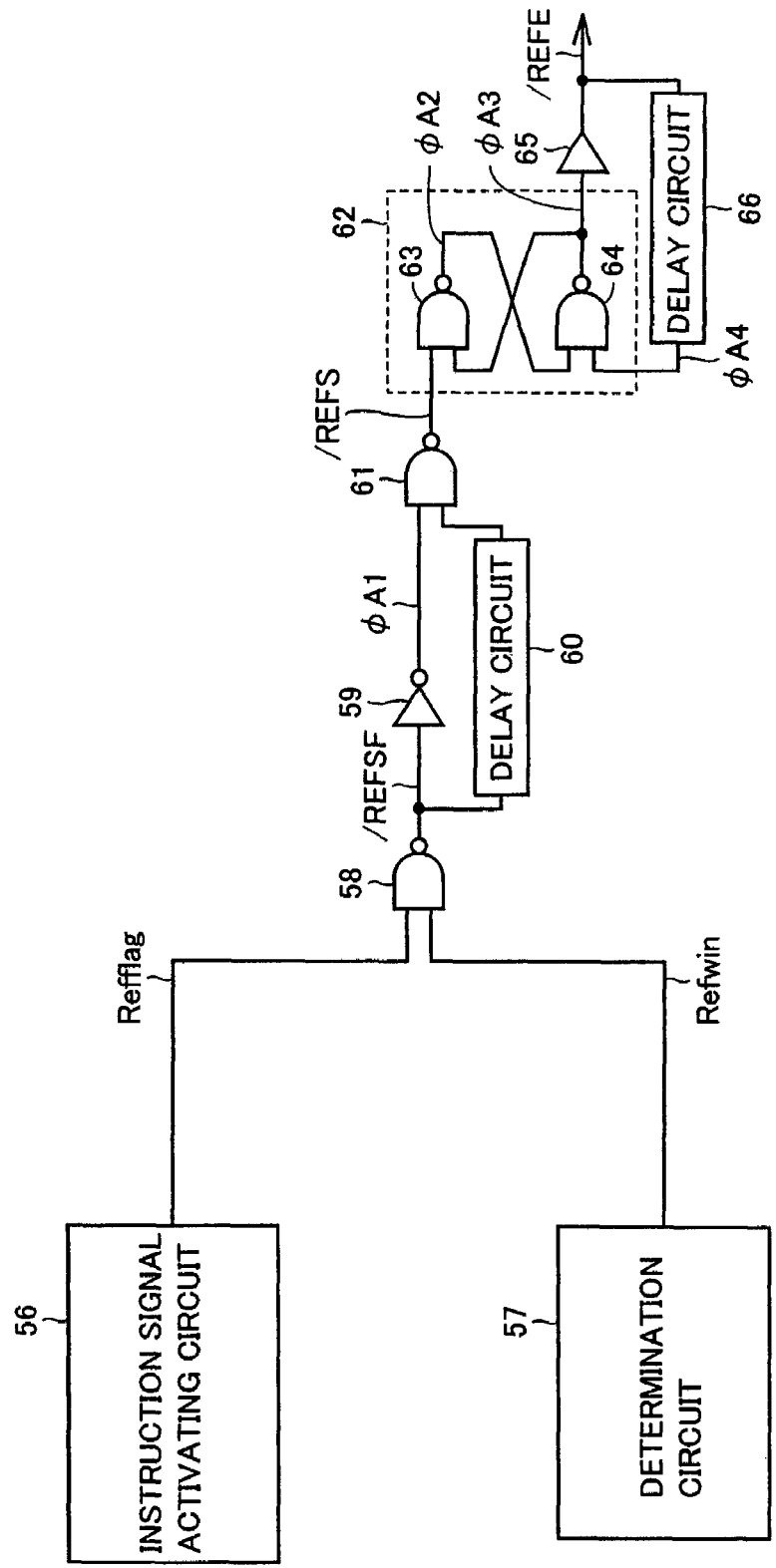
FIG. 4 is a circuit block diagram showing a configuration of a refresh instruction circuit included in a control circuit shown in FIG. 1.

Hereinafter, the refresh method that is a feature of this complete hidden refresh function-equipped DRAM will be explained in detail. FIG. 4 is a circuit block diagram showing a configuration of a refresh instruction circuit 55 that is included in control circuit 10 and that outputs a refresh instruction signal /REFE. Referring to FIG. 4, refresh instruction circuit 55 includes an instruction signal activating circuit 56, a determination circuit 57, NAND gates 58 and 61, an inverter 59, delay circuits 60 and 66, a flip-flop 62, and a buffer 65.

Instruction signal activating circuit 56 sets a refresh flag signal Refflag to an active level of an "H" level periodically, to activate refresh instruction signal /REFE. Determination circuit 57 determines whether to output refresh instruction signal /REFE or not, and sets a determination signal Refwin to an active level of an "H" level when the signal /REFE is to be output, and sets determination signal Refwin to an inactive level of an "L" level when the signal /REFE is not to be output.

NAND gate 58 receives refresh flag signal Refflag and determination signal Refwin, and outputs an inverted signal /REFSF of their logical product signal. Signal /REFSF attains an active level of an "L" level when refresh flag signal Refflag and determination signal Refwin are both at an "H" level. Inverter 59 outputs an inverted signal φA1 of output signal /REFSF of NAND gate 58. Delay circuit 60 delays signal /REFSF by a prescribed period of time. NAND gate 61 receives output signal φA1 of inverter 59 and an output signal of delay circuit 60, and outputs an inverted signal /REFS of their logical product signal. Signal /REFS is set to an "L" level for a period of delay by delay circuit 60, in response to falling of signal /REFSF from an "H" level to an "L" level.

Flip-flop 62 is formed of NAND gates 63 and 64. NAND gate 63 receives signal /REFS and an output signal φA3 of NAND gate 64, and outputs an inverted signal φA2 of their logical product signal. NAND gate 65 receives output signal φA2 of NAND gate 64 and an output signal φA4 of delay circuit 66, and outputs an inverted signal φA3 of their logical product signal. Flip-flop 62 is set in response to a falling edge of signal /REFS, and reset in response to a falling edge of signal φA4. When flip-flop 62 is set, signal φA3 attains an "L" level. When flip-flop 62 is reset, signal φA3 attains an "H"

level. Buffer 65 buffers signal φA3, and outputs it as refresh instruction signal /REFE. Delay circuit 66 outputs signal φA4 that corresponds to refresh instruction signal /REFE delayed by a prescribed period of time.

Figure 5:
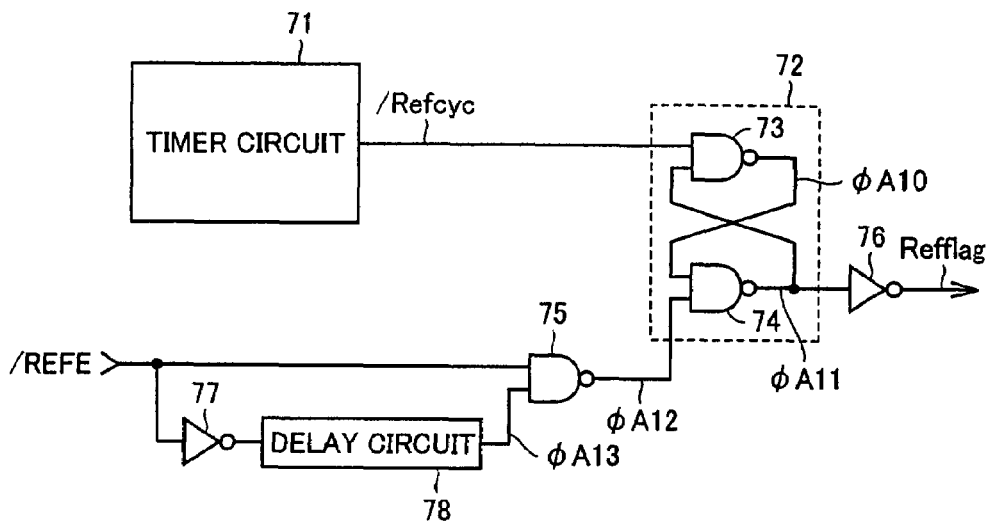
FIG. 5 is a circuit block diagram showing a configuration of an instruction signal activating circuit shown in FIG. 4.

FIG. 5 is a circuit block diagram showing a configuration of instruction signal activating circuit 56 in FIG. 4. Referring to FIG. 5, instruction signal activating circuit 56 includes a timer circuit 71, a flip-flop 72, a NAND gate 75, inverters 76 and 77, and a delay circuit 78. Timer circuit 71 includes a ring oscillator, and outputs a cycle signal /Refcyc that is set to an active level of an "L" level at a specified period. Inverter 77 outputs an inverted signal of refresh instruction signal /REFE. Delay circuit 78 outputs a signal φA13 that corresponds to the output signal of inverter 77 delayed by a prescribed period of time. NAND gate 75 receives refresh instruction signal /REFE and output signal φA13 of delay circuit 78, and outputs an inverted signal φA12 of their logical product signal. Signal φA12 is set to an "L" level for a period of delay of delay circuit 78 in response to rising of signal /REFE from an "L" level to an "H" level.

Flip-flop 72 is formed of NAND gates 73 and 74. NAND gate 73 receives cycle signal /Refcyc and an output signal φA11 of NAND gate 74, and outputs an inverted signal φA10 of their logical product signal. NAND gate 74 receives output signal φA10 of NAND gate 73 and output signal φA12 of NAND gate 75, and outputs an inverted signal φA11 of their logical product signal. Flip-flop 72 is set in response to a falling edge of signal /Refcyc, and reset in response to a falling edge of signal φA12. When flip-flop 72 is set, signal φA11 attains an "L" level. When flip-flop 72 is reset, signal φA11 attains an "H" level. Inverter 76 outputs an inverted signal of output signal φA11 of flip-flop 72 as refresh flag signal Refflag.

Figure 6:
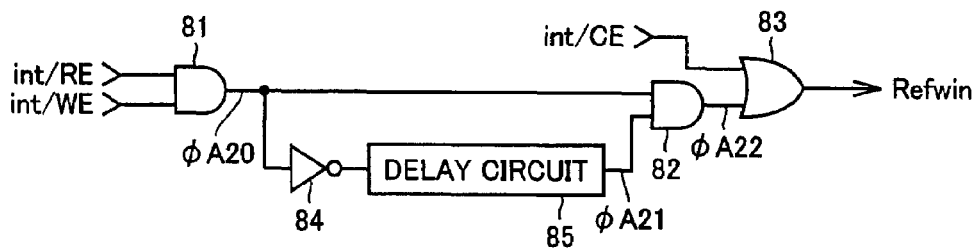
FIG. 6 is a circuit block diagram showing a configuration of a determination circuit shown in FIG. 4.

FIG. 6 is a circuit block diagram showing a configuration of determination circuit 57 in FIG. 4. Referring to FIG. 6, determination circuit 57 includes AND gates 81 and 82, an OR gate 83, an inverter 84, and a delay circuit 85. AND gate 81 receives an internal read enable signal int/RE and an internal write enable signal int/WE, and outputs their logical product signal φA20. It is noted that control circuit 10 generates internal read enable signal int/RE in response to output enable signal /OE externally provided via control signal input terminal group 1, and generates internal write enable signal int/WE in response to write enable signal /WE externally provided via control signal input terminal group 1.

Inverter 84 outputs an inverted signal of output signal φA20 of AND gate 81. Delay circuit 85 outputs a signal φA21 that corresponds to the output signal of inverter 84 delayed by a prescribed period of time. AND gate 82 receives output signal φA20 of AND gate 81 and output signal φA21 of delay circuit 85, and outputs their logical product signal φA22. OR gate 83 receives output signal φA22 of AND gate 82 and an internal chip enable signal int/CE, and outputs their logical sum signal as determination signal Refwin. It is noted that control circuit 10 generates internal chip enable signal int/CE in response to chip enable signal /CE externally provided via control signal input terminal group 1.

Figure 7:
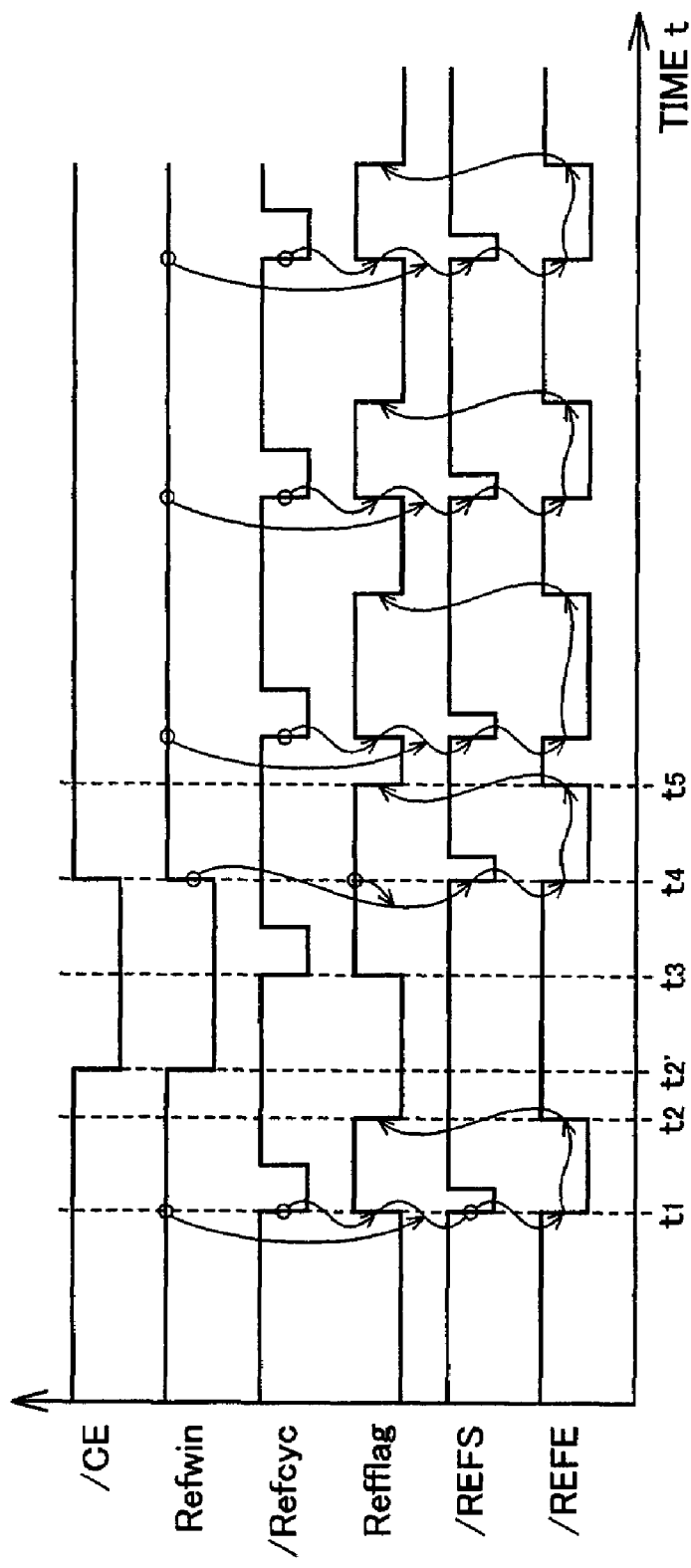
FIG. 7 is a timing chart illustrating an operation of the refresh instruction circuit shown in FIGS. 4-6.

Hereinafter, an operation of refresh instruction circuit 55 shown in FIGS. 4-6 will be described. Firstly, an operation of refresh instruction circuit 55 in the case where data write and data read are not performed, i.e., in the case where internal read enable signal int/RE and internal write enable signal int/WE are both fixed at an "H" level, will be described with reference to FIG. 7.

When internal read enable signal int/RE and internal write enable signal int/WE are both fixed at an "H" level, output signal φA22 of AND gate 82 in FIG. 6 is fixed at an "L" level, and internal chip enable signal int/CE, i.e., chip enable signal /CE, becomes determination signal Refwin. More specifically, when chip enable signal /CE is at an inactive level of an "H" level, the complete hidden refresh function-equipped DRAM is set to a standby mode. Accordingly, determination circuit 57 determines that the refresh operation can be carried out, and that refresh instruction circuit 55 can set refresh instruction signal /REFE to an active level of an "L" level, and thus, it sets determination signal Refwin to an active level of an "H" level.

At time t1, when cycle signal /Refcyc output from timer circuit 71 is lowered from an "H" level to an "L" level, flip-flop 72 is set, and refresh flag signal Refflag is raised from an "L" level to an "H" level. In response thereto, NAND gate 58 in FIG. 4 receives determination signal Refwin set to an "H" level and refresh flag signal Refflag set to an "H" level, and sets signal /REFSF to an active level of an "L" level. NAND gate 61 sets signal /REFS to an "L" level for a time period that corresponds to the delay time of delay circuit 60.

Flip-flop 62 is set in response to a falling edge of signal /REFS, and refresh instruction signal /REFE is pulled down to an active level of an "L" level. After a lapse of the delay time of delay circuit 66, flip-flop 62 is reset, and refresh instruction signal /REFE is raised to an "H" level. In this manner, refresh instruction signal /REFE is set to an active level of an "L" level for a prescribed period of time from time t1.

As described above, when refresh flag signal Refflag output from instruction signal activating circuit 56 is activated at time t1, determination circuit 57 determines that the refresh operation can be carried out, and sets determination signal Refwin to an active level of an "H" level. This allows the refresh operation to be carried out while the complete hidden refresh function-equipped DRAM is in the standby mode.

Refresh instruction signal /REFE output from refresh instruction circuit 55 is inactivated at time t2 after a lapse of a prescribed time set by delay circuit 66. At this time, output signal φA12 of NAND gate 75 in FIG. 5 attains an "L" level, flip-flop 72 is reset, and refresh flag signal Refflag is set to an inactive level of an "L" level.

Next, at time t2', chip enable signal /CE is pulled down to an active level of an "L" level. The complete hidden refresh function-equipped DRAM is set to an active mode, and determination circuit 57 determines that the refresh operation cannot be carried out unless the read or write operation is finished, and thus, it sets determination signal Refwin to an inactive level of an "L" level.

Next, at time t3, cycle signal /Refcyc, which is activated at a specified period, is set to an active level of an "L" level. Correspondingly, flip-flop 72 in FIG. 5 is set, and refresh flag signal Refflag is set to an active level of an "H" level.

Determination signal Refwin output from determination circuit 57 however is at an inactive level of an "L" level, and thus, output signal /REFS of NAND gate 61 maintains an inactive level of an "H" level. Accordingly, refresh instruction signal /REFE remains at an inactive level of an "H" level.

Since refresh instruction signal /REFE maintains an "H" level, output signal φA12 of NAND gate 75 in FIG. 5 remains at an "H" level, and output signal φA11 of flip-flop 72 remains at an "L" level. As a result, refresh flag signal Refflag is at an active level of an "H" level after time t3.

As described above, during the time when chip enable signal /CE is at an active level of an "L" level, determination circuit 57 determines that the refresh operation cannot be performed unless the read or write operation is finished. When refresh flag signal Refflag is set to an active level of an "H" level during the time when determination circuit 57 determines that the refresh operation cannot be performed, refresh flag signal Refflag is maintained at an "H" level.

Next, at time t4, if chip enable signal /CE is set to an inactive level of an "H" level and the complete hidden refresh function-equipped DRAM is set again to a standby mode without performing the read or write operation, determination circuit 57 determines that the refresh operation can be carried out, and thus rises determination signal Refwin to an active level of an "H" level.

Here, since refresh flag signal Refflag is in an active state after time t3, at time t4, output signal /REFS of NAND gate 61 in FIG. 4 attains an active level of an "L" level only for a prescribed period of time set by delay circuit 60. In response, flip-flop 62 is set, and refresh instruction signal /REFE is set to an active level of an "L" level only for a prescribed period of time set by delay circuit 66.

At time t5, i.e., after a lapse of the prescribed period of time set by delay circuit 66 from time t4, refresh instruction signal /REFE is inactivated. In response to inactivation of refresh instruction signal /REFE, refresh flag signal Refflag is also inactivated.

After time t5 as well, refresh instruction circuit 55 activates refresh instruction signal /REFE in response to refresh flag signal Refflag every time refresh flag signal Refflag is activated during the period in which determination circuit 57 determines that the refresh operation can be carried out.

By the operation described above, determination circuit 57 determines that the refresh operation can be carried out when chip enable signal /CE is at an inactive level of an "H" level, i.e., when the complete hidden refresh function-equipped DRAM is in a standby mode. When chip enable signal /CE is at an active level of an "L" level, i.e., when the complete hidden refresh function-equipped DRAM is in an active mode, determination circuit 57 determines that the refresh operation cannot be performed until the read or write operation is finished.

Further, during the time in which determination circuit 57 determines that the refresh operation cannot be carried out, if cycle signal /Refcyc output from timer circuit 71 is activated, refresh flag signal Refflag is maintained in an active state. That is, the refresh operation is awaited. This enables the refresh operation to be carried out immediately once determination circuit 57 determines that it is possible to carry out the refresh operation.

Figure 8:
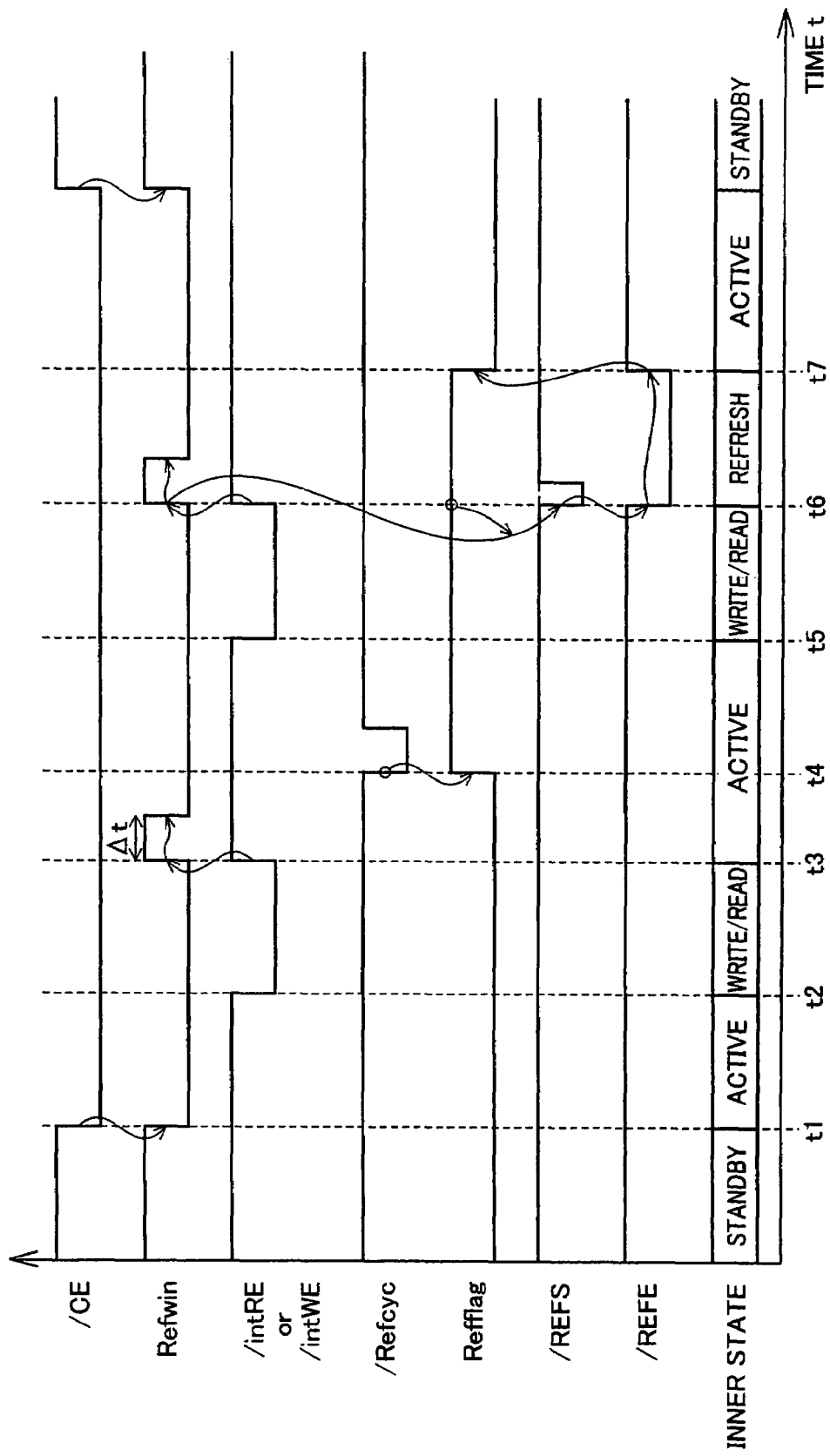
FIG. 8 is another timing chart illustrating the operation of the refresh instruction circuit shown in FIGS. 4-6.

FIG. 8 is a timing chart illustrating an operation of refresh instruction circuit 55 in the case where data write and/or read is carried out, i.e., in the case where internal read enable signal int/RE and/or internal write enable signal int/WE is set to an active level of an "L" level.

Referring to FIG. 8, at time t1, when chip enable signal /CE is set to an active level of an "L" level, the complete hidden refresh function-equipped DRAM is set to an active mode. Since internal read enable signal int/RE or internal write enable signal int/WE is at an inactive level of an "H" level at time t1, output signal φA22 of AND gate 82 in FIG. 6 is at an "L" level. Thus, determination signal Refwin output from OR gate 83 attains an inactive level of an "L" level.

When internal read enable signal int/RE or internal write enable signal int/WE is set to an active level of an "L" level at time t2, the read or write operation is initiated. At this time, output signal φA20 of AND gate 81 in FIG. 6 attains an "L" level, and output signal φA22 of AND gate 82 attains an "L" level. Accordingly, determination signal Refwin output from OR gate 83 is maintained at an inactive level of an "L" level.

At time t3, internal read enable signal int/RE or internal write enable signal int/W is raised to an inactive level of an "H" level, and the read or write operation is finished. At this time, output signal φA20 of AND gate 81 in FIG. 6 attains an "H" level. Output signal φA21 of delay circuit 85 is maintained at an "H" level for a specified time Δt from time t3. Thus, output signal φA22 of AND gate 82 is at an "H" level for specified period Δt from time t3, and accordingly, determination signal Refwin output from OR gate 83 is maintained at an active level of an "H" level for specified period Δt from time t3. By the operation described above, determination circuit 57 determines that the refresh operation can be carried out during the specified time Δt after completion of the read or write operation.

At time t3, although determination signal Refwin is activated, cycle signal /Refcyc is still in an inactive state. Thus, refresh flag signal Refflag output from instruction signal activating circuit 56 is in an inactive state as well. Thus, at time t3, refresh instruction signal /REFE output from refresh instruction circuit 55 remains at an inactive level of an "H" level.

When cycle signal /Refcyc is pulled down to an active level of an "L" level at time t4, refresh flag signal Refflag is raised to an active level of an "H" level. At this time, determination signal Refwin is at an inactive level of an "L" level. Thus, refresh instruction signal /REFE is maintained at an inactive level of an "H" level. After time t4, refresh flag signal Refflag is maintained at an active level of an "H" level.

At time t5, the read or write operation is initiated again. When the read or write operation is finished at time t6, determination signal Refwin is set to an active state for a specified time Δt from time t6, as in the case of time t4.

Refresh flag signal Refflag is maintained in an active state since time t4. Thus, output signal /REFS of NAND gate 61 in FIG. 4 attains an active level of an "L" level for a prescribed period of time set by delay circuit 60. When signal /REFS is pulled down to an "L" level, refresh instruction signal /REFE attains an active level of an "L" level within a prescribed period of time set by delay circuit 66 after time t6. The refresh operation is thus carried out. When refresh instruction signal /REFE is inactivated at time t7, refresh flag signal Refflag is inactivated correspondingly.

If internal read enable signal int/RE or internal write enable signal int/WE is set to an active level of an "L" level again during the refresh operation from time t6 to time t7, the read or write operation is carried out after completion of the refresh during time t6 to t7.

With the operation described above, determination circuit 57 determines that the refresh operation can be performed during a prescribed period of time after completion of the read or write operation even in an active mode. Thus, when determination circuit 57 determines that the refresh operation can be carried out, if refresh flag signal Refflag is in an active state, refresh instruction signal /REFE is activated. That is, the complete hidden refresh function-equipped DRAM performs the refresh operation after completion of the write or read operation. This means that the refresh operation would not be carried out at the same timing as the read or write operation even if the complete hidden refresh function-equipped DRAM is in the active mode. Further, even in the case where chip enable signal /CE is in an active level for a long period of time, data destruction due to the absence of the refresh operation for a long time can be prevented. Furthermore, rapid access is possible since the refresh operation is carried out after the write or read operation without fail.

Still further, the complete hidden refresh function-equipped DRAM does not reset each of way selection signals RX0-1, RX1-1, . . . to an "L" level at each cycle in the case where the refresh operation is carried out in a standby mode, for the purpose of decreasing consumed power. Hereinafter, the operation will be described in detail.

Figure 9:
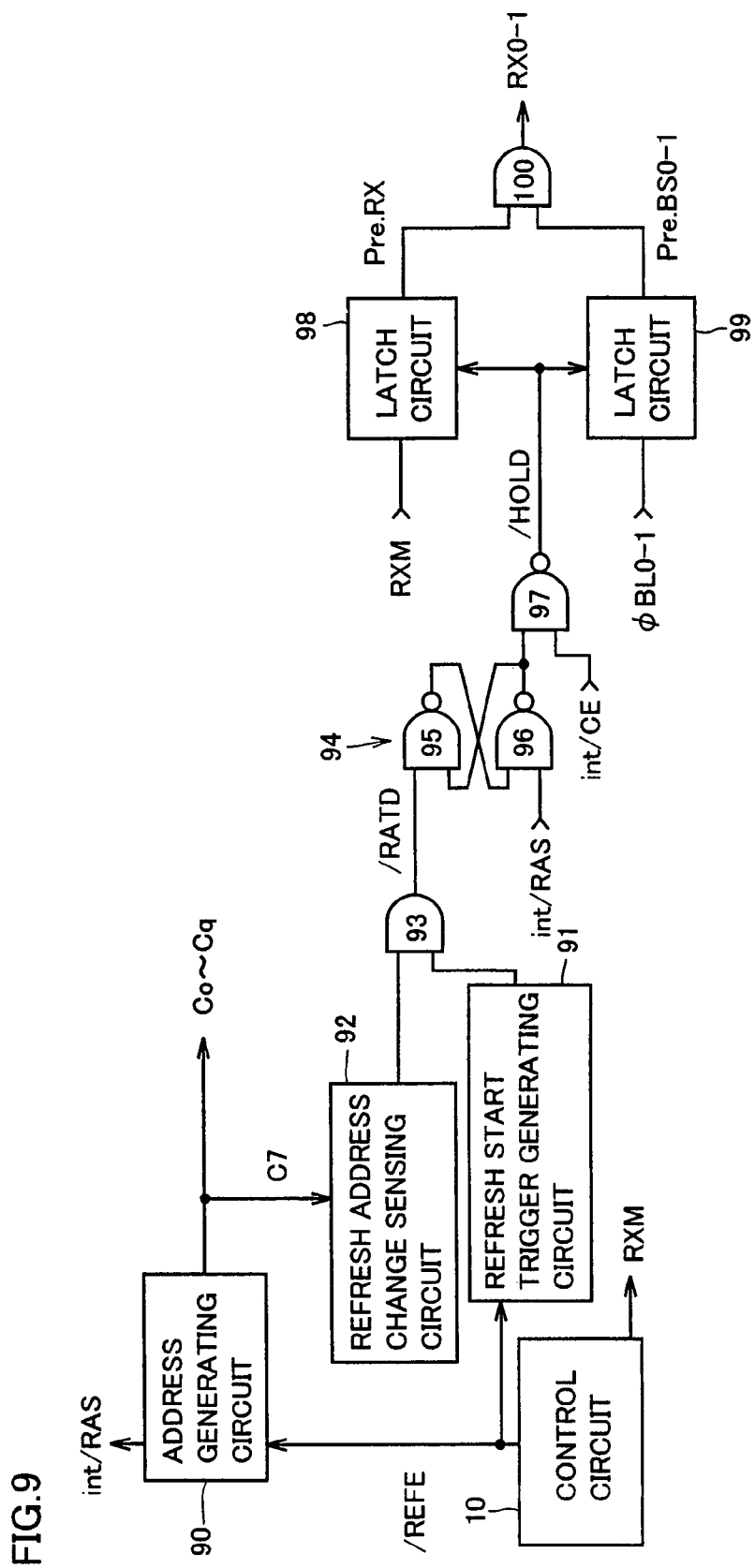
FIG. 9 is a circuit block diagram showing a portion of the row decoder of FIG. 1 related to a refresh operation.

FIG. 9 is a circuit block diagram showing a portion of row decoder 14 related to data refresh. Referring to FIG. 9, row decoder 14 includes an address generating circuit 90, a refresh start trigger generating circuit 91, a refresh address change sensing circuit 92, AND gates 93 and 100, a flip-flop 94, a NAND gate 97, and latch circuits 98 and 99.

Figure 10:
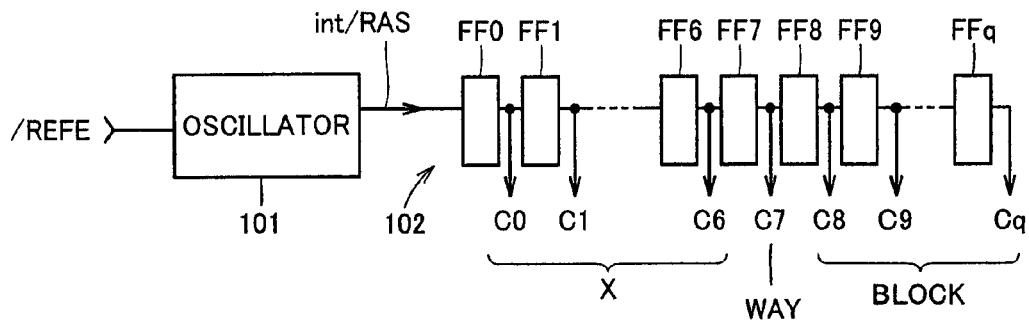
FIG. 10 is a block diagram showing a configuration of an address generating circuit shown in FIG. 9.

Address generating circuit 90 includes an oscillator 101 and an address counter 102, as shown in FIG. 10. Oscillator 101 is activated when refresh instruction signal /REFE output from control circuit 10 is at an "L" level, and outputs an internal clock signal int/RAS of a prescribed frequency. Address counter 102 includes a plurality of flip-flops FF0-FFq connected in series, and counts the number of pulses of internal clock signal int/RAS output from oscillator 101. The outputs of flip-flops FF0-FFq become refreshing row address signals C0-Cq, respectively. Row address signals C0-C6 correspond to signal group X. Row address signal C7 is used for selecting a way. Row address signals C8-Cq are used for selecting a memory block BK.

Refresh start trigger generating circuit 91 normally outputs a signal of an "H" level, and outputs a pulse of an "L" level in response to refresh instruction signal /REFE attaining an active level of an "L" level. Refresh address change sensing circuit 92 normally outputs a signal of an "H" level, and outputs a pulse of an "L" level in response to a change in address signal C7, that is, an output of flip-flop FF7 in address generating circuit 90. AND gate 93 receives an output signal of refresh start trigger generating circuit 91 and an output signal of refresh address change sensing circuit 92, and outputs their logical product signal /RATD.

Flip-flop 94 includes two NAND gates 95 and 96. Flip-flop 94 is set in accordance with a falling edge of signal /RATD, and reset in accordance with a falling edge of internal clock signal int/RAS output from oscillator 101 in address generating circuit 90. NAND gate 97 receives an output signal of flip-flop 94 and internal chip enable signal int/CE, and outputs an inverted signal /HOLD of their logical product signal.

Figure 11:
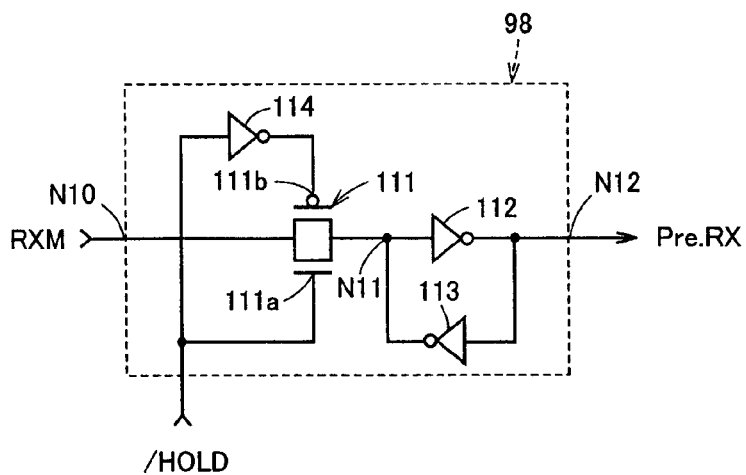
FIG. 11 is a circuit block diagram showing a configuration of a latch circuit 98 shown in FIG. 9.
Figure 12:
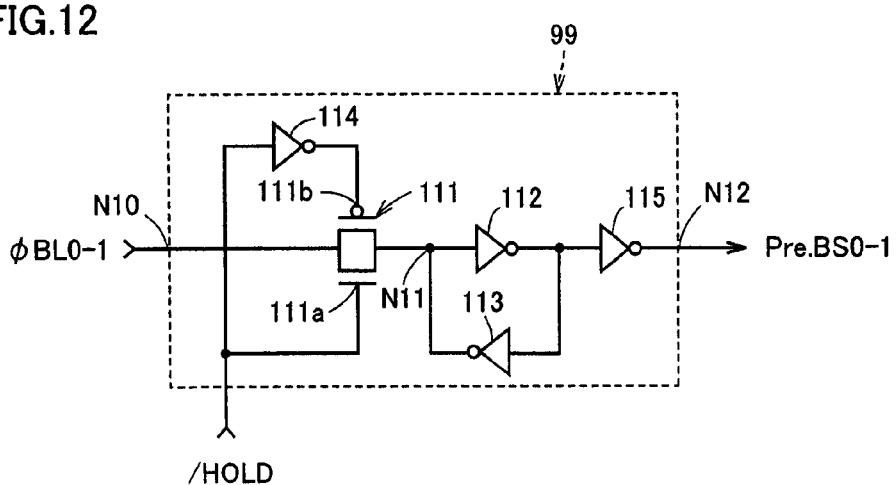
FIG. 12 is a circuit block diagram showing a configuration of a latch circuit 99 shown in FIG. 9.

Latch circuit 98 includes a transfer gate 111 and inverters 112-114, as shown in FIG. 11. Transfer gate 111 is connected between an input node N10 and an intermediate node N11, inverter 112 is connected between intermediate node N11 and an output node N12, and inverter 113 is connected between output node N12 and intermediate node N11. Signal /HOLD is directly input to a gate 111a of transfer gate 111 on the side of an N channel MOS transistor, and also input via inverter 114 to a gate 111b of transfer gate 111 on the side of a P channel MOS transistor. Accordingly, an input level at the time when signal /HOLD falls from an "H" level to an "L" level is latched by inverters 112 and 113. Latch circuit 99 has a structure similar to that of latch circuit 98, to which an inverter 115 is added, as shown in FIG. 12. Inverter 115 is connected between an output node of inverter 112 and output node N12. A signal RXM is input to latch circuit 98, while a signal φBL0-1 is input to latch circuit 99.

AND gate 100 receives output signals Pre.RX and Pre.BS0-1 of latch circuits 98 and 99, respectively. An output of AND gate 100 is a signal RX0-1. Latch circuit 99 and AND gate 100 are provided corresponding to each of signals RX0-1, RX1-1 to RX0-m, RX1-m.

Figure 13:
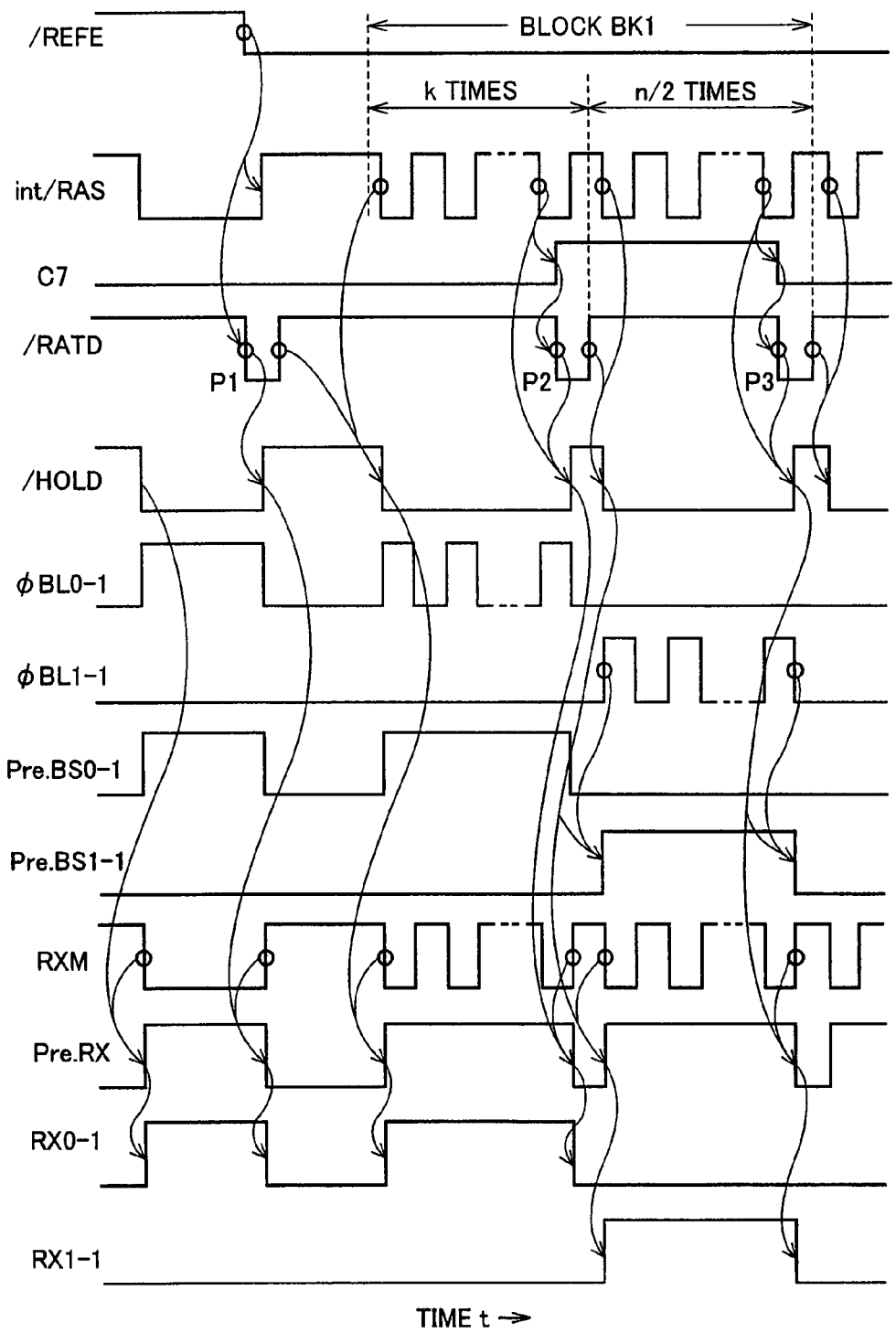
FIG. 13 is a timing chart illustrating an operation of the circuit portion shown in FIG. 9.

Hereinafter, an operation of the circuit portion shown in FIGS. 9-12 will be described. FIG. 13 is a timing chart illustrating the operation of row decoder 14 in the case where internal chip enable signal int/CE is at an "H" level, i.e., in a standby mode. In this case, NAND gate 97 operates as an inverter with respect to an output signal of flip-flop 94. When refresh instruction signal /REFE is pulled down to an "L" level of an active level, internal clock signal int/RAS is output from oscillator 101 of address generating circuit 90, and a counting operation of address counter 102 is initiated.

A pulse signal P1 at an "L" level is output from refresh start trigger generating circuit 91 in response to refresh instruction signal /REFE attaining an "L" level. Pulse signals P2, P3, . . . at an "L" level are output from refresh address change sensing circuit 92 in response to a change in address signal C7, i.e., an output signal of flip-flop FF7 of address generating circuit 90. Pulse signals P1, P2, P3, . . . pass through AND gate 93 to be a signal /RATD.

Flip-flop 94 is set in accordance with a falling edge of signal /RATD to an "L" level, and is reset in accordance with a falling edge of internal clock signal int/RAS to an "L" level. When flip-flop 94 is set, the output signal of flip-flop 94 is pulled down to an "L" level. When flip-flop 94 is reset, the output signal of flip-flop 94 is raised to an "H" level. Here, since internal chip enable signal int/CE is at an "H" level, the inverted signal of the output signal of flip-flop 94 becomes signal /HOLD.

Signals φBL0-1 and φBL1-1 are signals generated within row decoder 14 based on internal clock signal int/RAS and the outputs C7-Cq of flip-flops FF7-FFq of address generating circuit 90. Signal φBL0-1 indicates that one way W0 of memory block BK1 has been selected, which is an inverted signal of internal clock signal int/RAS during the period in which way W0 of memory block BK1 is selected. Signal φBL1-1 indicates that other way W1 of memory block BK1 has been selected, which is an inverted signal of internal clock signal int/RAS during the period in which way W1 of memory block BK1 is selected.

Signal φBL0-1 is latched by latch circuit 99 when signal /HOLD falls from an "H" level to an "L" level, and is unlatched from latch circuit 99 when signal /HOLD rises from an "L" level to an "H" level. An output of latch circuit 99 becomes a signal Pre.BS0-1. Similarly, signal φBL1-1 becomes a signal Pre.BS1-1. As such, for each of signals φBL0-1 and φBL1-1, the portion that swings at the same period as that of internal clock signal int/RAS is made constant at an "H" level.

Signal RXM is a signal that swings at approximately the same timing as internal clock signal int/RAS, and is output from control circuit 10. Signal RXM is latched by latch circuit 98 when signal /HOLD falls from an "H" level to an "L" level, and is unlatched from latch circuit 98 when signal /HOLD rises from an "L" level to an "H" level. An output of latch circuit 98 is a signal Pre.RX. Thus, signal Pre.RX is an inverted signal of signal /HOLD. A logical product signal of signals Pre.RX and Pre.BS0-1 is a signal RX0-1. A logical product signal of signals Pre.RX and Pre.BS1-1 is a signal RX1-1. Word drivers 50 and 51 of FIG. 3 are activated by these signals RX0-1 and RX1-1.

While word driver 50 of way W0 is activated by signal RX0-1, word lines WLs belonging to way W0 are sequentially selected, so that data refresh is carried out. While word driver 51 of way W1 is activated by signal RX1-1, word lines WLs belonging to way W1 are sequentially selected, so that data refresh is carried out. Then, a block BK2 is selected, and a similar operation is carried out.

When internal chip enable signal int/CE is at an "L" level, i.e., in an active mode, signal /HOLD is fixed at an "H" level, and transfer gate 111 of each of latch circuits 98 and 99 is rendered conductive. Thus, the inverted signal of signal RXM becomes signal Pre.RX, and signal φBL0-1 becomes signal Pre.BS0-1. As such, signals RX0-1, RX1-1 become signals φBL0-1 and φBL1-1, respectively, which swing at each cycle.

In a standby mode, an address to be selected in a next cycle can be expected, without interruption of a read or write operation during the refresh operation. Thus, it is no problem to maintain the way select signal RX at an "H" level, instead of resetting the same, even after the refresh cycle is finished. In the active mode, however, the refresh operation is carried out by interrupting the read or write operation. Thus, it is not possible to expect which address is to be selected after the refresh cycle. Therefore, it is necessary to reset way select signal RX for each refresh cycle so as to enable rapid access in a cycle following the refresh cycle.

In the first embodiment, when chip enable signal /CE is at an "H" level, i.e., in the standby mode, an upper address is assigned to each of ways W0 and W1 and a lower address is assigned to each word line WL belonging to each of ways W0 and W1. Furthermore, while a word line WL in one way W (W0, for example) of one memory block BK (BK1, for example) is selected, a signal RX (RX0-1, in this case) is retained at an "H" level of an active level (boosted voltage Vpp) without being reset. Consequently, power consumption is reduced compared to the conventional example in which a signal RX is raised to an "H" level and then reset to an "L" level every time one word line WL is selected. More specifically, since signal RX needs to be reset only once for a period during which n/2 word lines WLs are selected (only once for k word lines (where k<n/2) in the case of the initially selected way W0), power required to reset signal RX is reduced to about 2/n compared to the conventional example. Since the number of word lines WLs per one memory block BK is normally 256 or 512, power consumption will be reduced to one-several hundredth. Moreover, since voltage Vpp of the amplitude of signal RX is greater than power supply voltage VCC, the effect of reducing the power consumption by decreasing the number of times of reset of signal RX is significant.

Further, when chip enable signal /CE is at an "L" level, i.e., in the active mode, signal RX is reset at each cycle, so that the write and read operations can be carried out quickly.

Although the number of ways has been set to two in the first embodiment, the same effect can of course be obtained with three ways or more.

Second Embodiment

Figure 14:
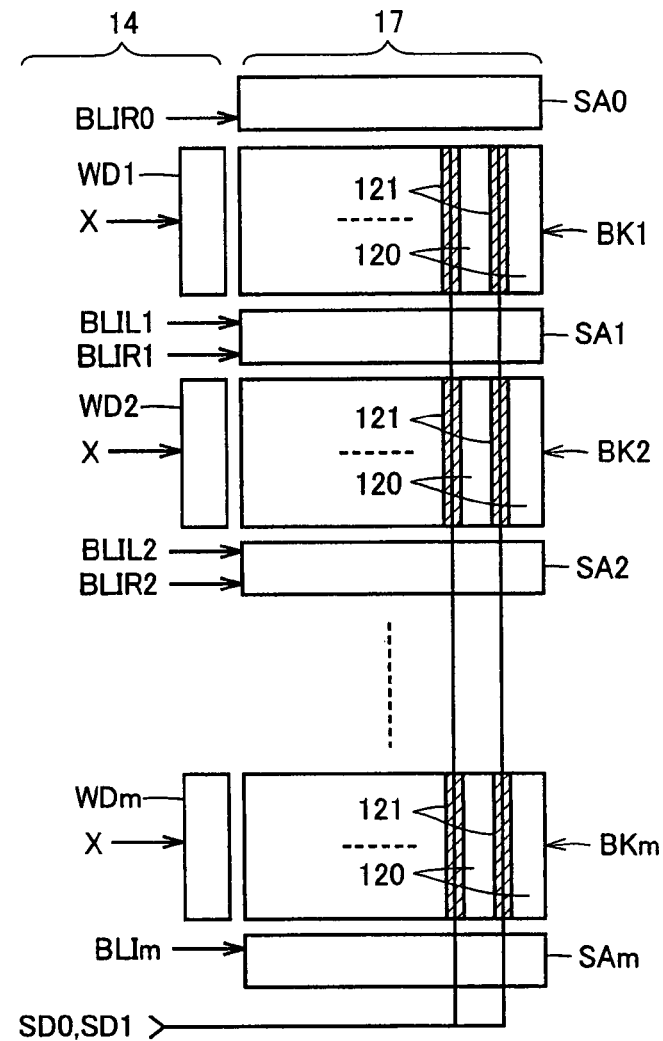
FIG. 14 is a block diagram showing layout of a row decoder and a memory mat of a complete hidden refresh function-equipped DRAM according to a second embodiment of the present invention.
Figure 15:
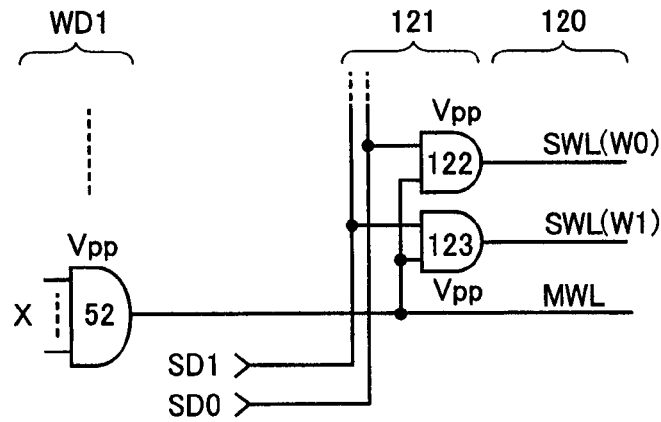
FIG. 15 is a circuit diagram showing a main part of the row decoder and the memory mat shown in FIG. 14.

FIG. 14 is a diagram showing layout of a row decoder 14 and a memory mat 17 of a complete hidden refresh function-equipped DRAM according to a second embodiment of the present invention, and FIG. 15 is an enlarged view of a main part of FIG. 14.

Referring to FIGS. 14 and 15, a divided word line method and a 2-way method are used in this complete hidden refresh function-equipped DRAM. Each word line WL in each of memory blocks BK1-BKm is divided into a plurality of sub-word lines SWLs, each of memory blocks BK1-BKm is divided into a plurality of sub-blocks 120, and a SD band 121 is provided corresponding to each sub-block 120.

A plurality of sub-word lines SWLs of each sub-block 120 are divided into two ways W0 and W1. Way W0 includes a sub-word line SWL in an odd row, and way W1 includes a sub-word line SWL in an even row. Sub-decode signals SD0 and SD1 are assigned to ways W0 and W1, respectively, and a signal group X is assigned to each sub-word line SWL belonging to each of ways W0 and W1. Respective sub-word lines SWLs of each sub-block 120 are specified by signals SD0 and SD1 and signal group X.

In order to realize the 2-way method, each SD band includes a word driver 122 provided corresponding to each odd row of corresponding sub-block 120, and a word driver 123 provided corresponding to each even row of corresponding sub-block 120. Further, each of word driver groups WD1-WDm includes a word driver 52 provided corresponding to adjacent word drivers 122 and 123 of SD band 121 of corresponding one of memory blocks BK1-BKm. Word driver 52 receives signal group X. Word driver 122 receives an output of word driver 52 and signal SD0. Word driver 123 receives the output of word driver 52 and signal SD1. Outputs of word drivers 122 and 123 are applied respectively to corresponding sub-word lines SWLs. Each of word drivers 52, 122 and 123 is driven by boosted potential Vpp and ground potential GND. The selected level of the main word line MWL, the selected level of sub-word line SWL, the active levels of signals SD0 and SD1, and the active level of signal group X all correspond to boosted potential Vpp.

Figure 16:
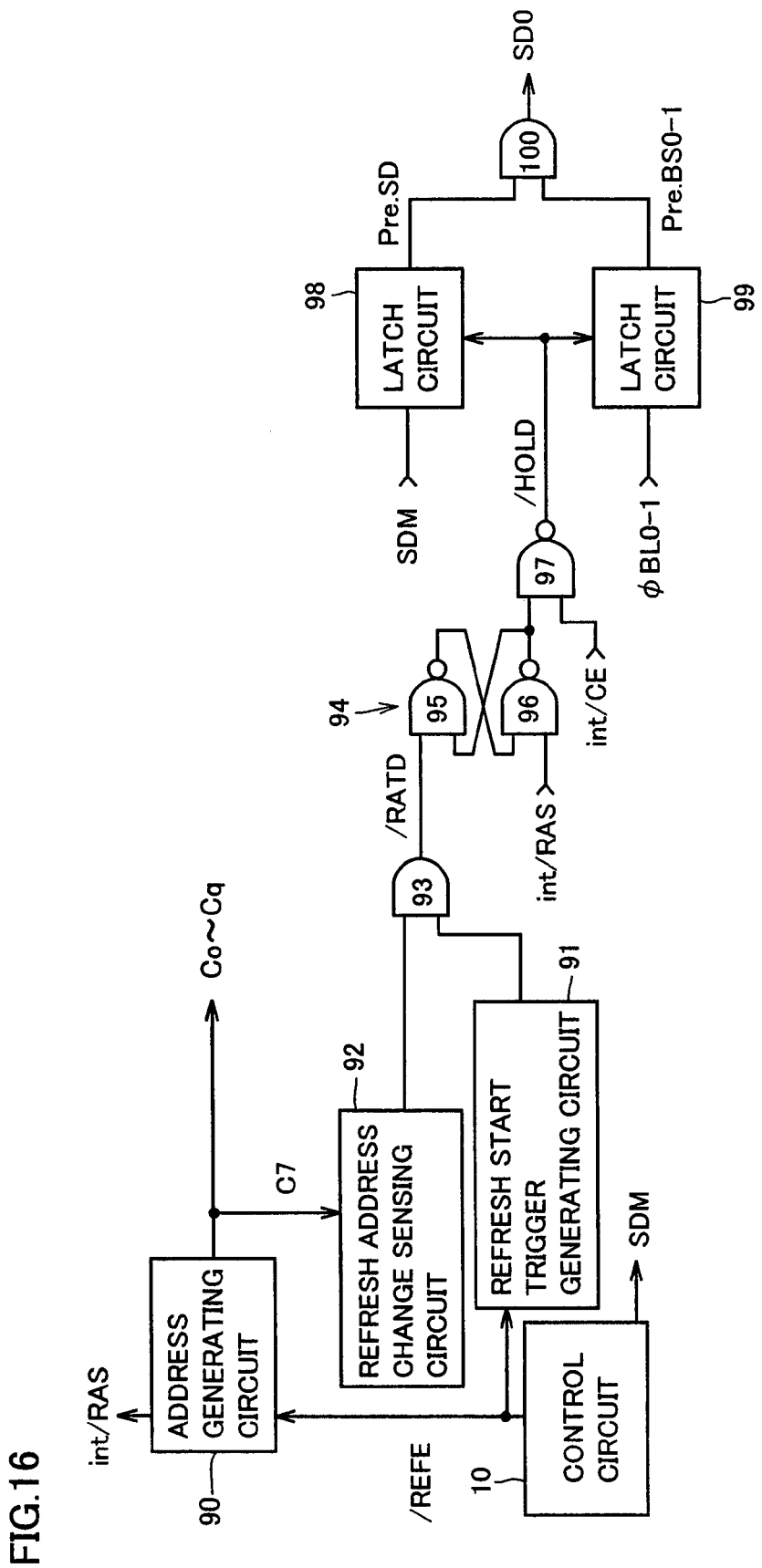
FIG. 16 is a circuit block diagram showing a portion of the row decoder of FIG. 14 related to the refresh operation.
Figure 17:
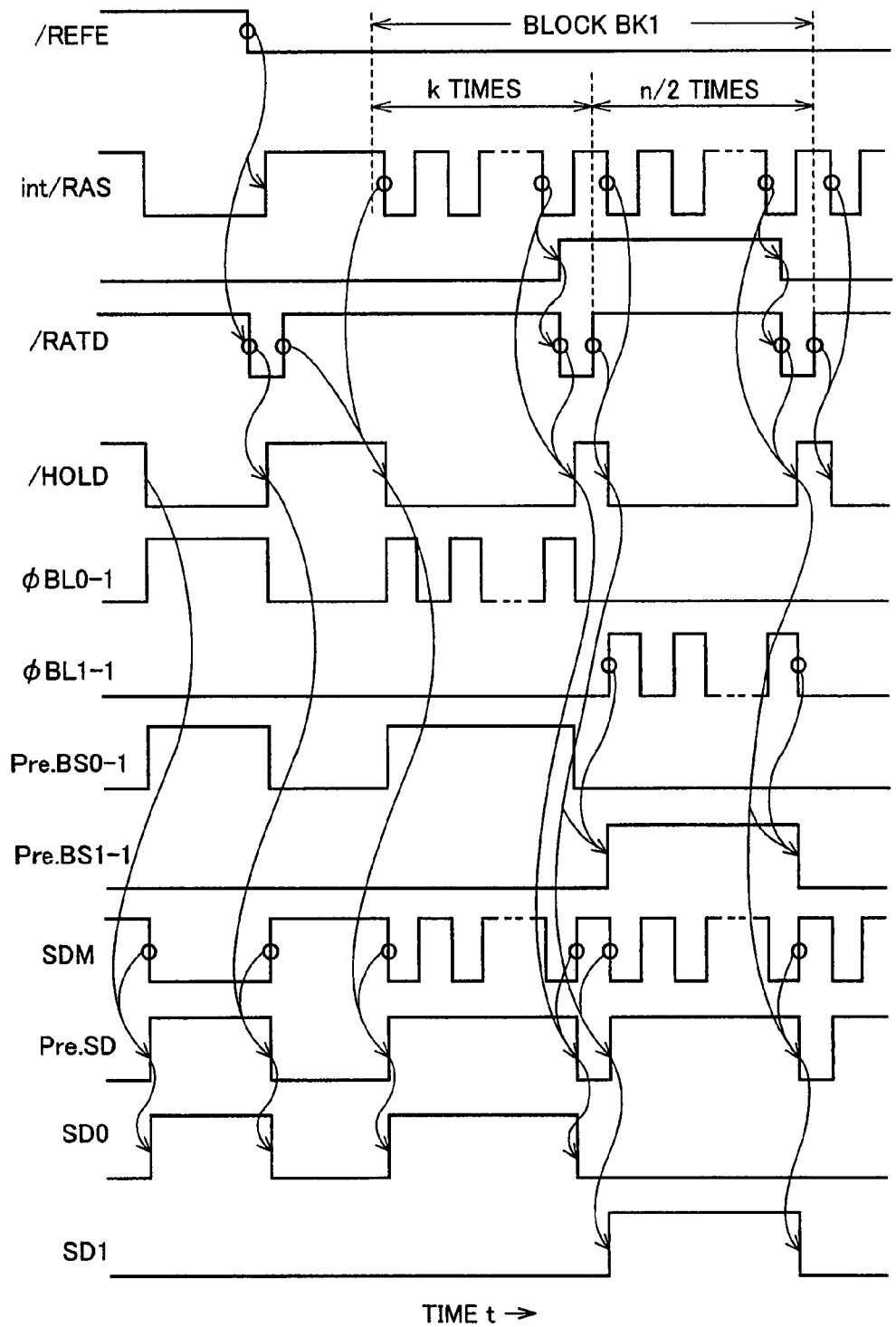
FIG. 17 is a timing chart illustrating an operation of the circuit portion shown in FIG. 16.

FIG. 16 is a circuit block diagram showing a circuit for generating a signal SD in the complete hidden refresh function-equipped DRAM shown in FIGS. 14 and 15, and FIG. 17 is a timing chart illustrating an operation thereof.

The circuit configuration and operation shown in FIGS. 16 and 17 are similar to those of FIGS. 9 and 13, except that signals RXM, Pre.RX, RX0-1 and RX1-1 are replaced with signals SDM, Pre.SD, SD0 and SD1, respectively. More specifically, in the case where chip enable signal /CE is at an "H" level, signals SD0 and SD1 for selecting ways W0 and W1 are not reset while sub-word lines SWLs belonging to respective ways W0 and W1 are selected. In the case where chip enable signal /CE is at an "L" level, signals SD0 and SD1 for selecting ways W0 and W1 are reset at each cycle. The other configuration and operation are identical to those of the first embodiment, and thus, description thereof will not be repeated here.

The same effects as those of the first embodiment can be obtained in the second embodiment.

Third Embodiment

Figure 18:
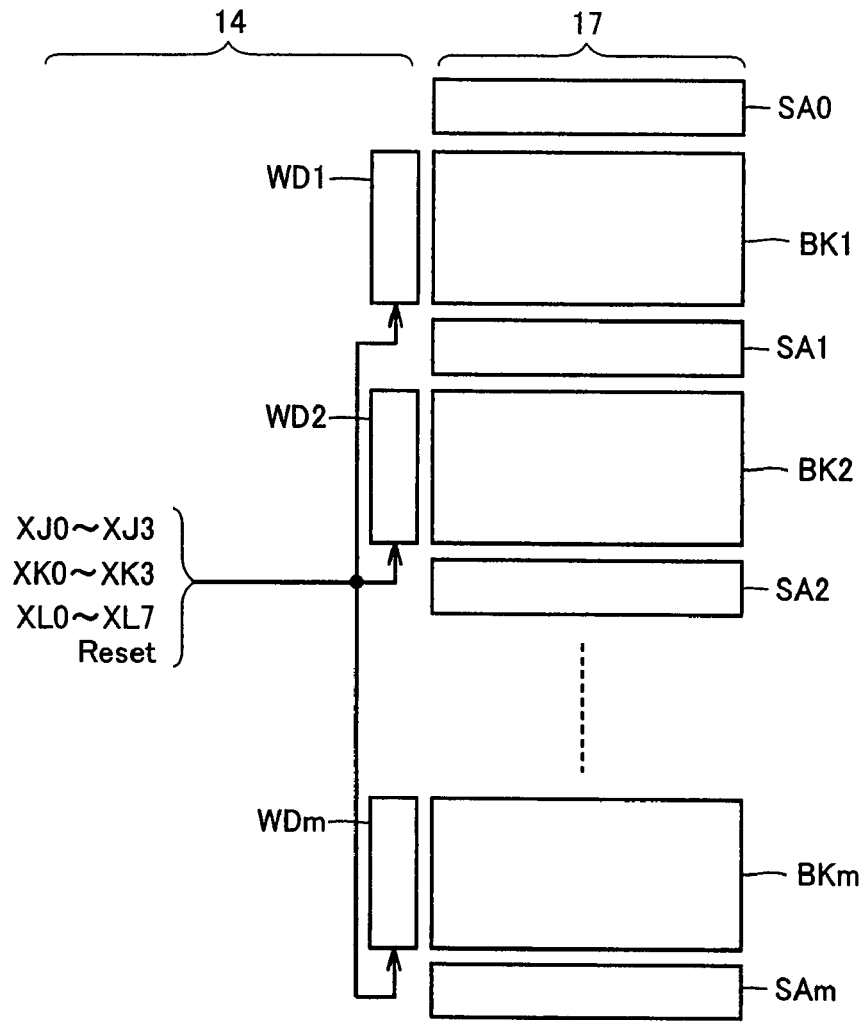
FIG. 18 is a block diagram showing layout of a row decoder and a memory mat of a complete hidden refresh function-equipped DRAM according to a third embodiment of the present invention.
Figure 19:
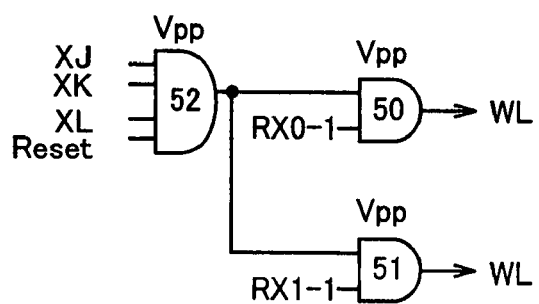
FIG. 19 is a circuit diagram showing a main part of a word driver group shown in FIG. 18.

FIG. 18 is a diagram showing layout of a row decoder 14 and a memory mat 17 of a complete hidden refresh function-equipped DRAM according to a third embodiment of the present invention, and FIG. 19 is a circuit diagram showing a main part of a word driver group WD shown in FIG. 18.

Referring to FIGS. 18 and 19, in this complete hidden refresh function-equipped DRAM, predecode signal groups XJ, XK, XL and Reset are formed in row decoder 14 in place of signal group X. Predecode signal groups XJ, XK, XL and Reset are applied to each word driver 52. Each of word drivers 50-52 is driven by boosted potential Vpp and ground potential GND. The selected level of word line MWL, the active levels of signals RX0-1 and RX1-1, and the active levels of signals XJ, XK, XL and Reset all correspond to boosted potential Vpp.

Figure 20:
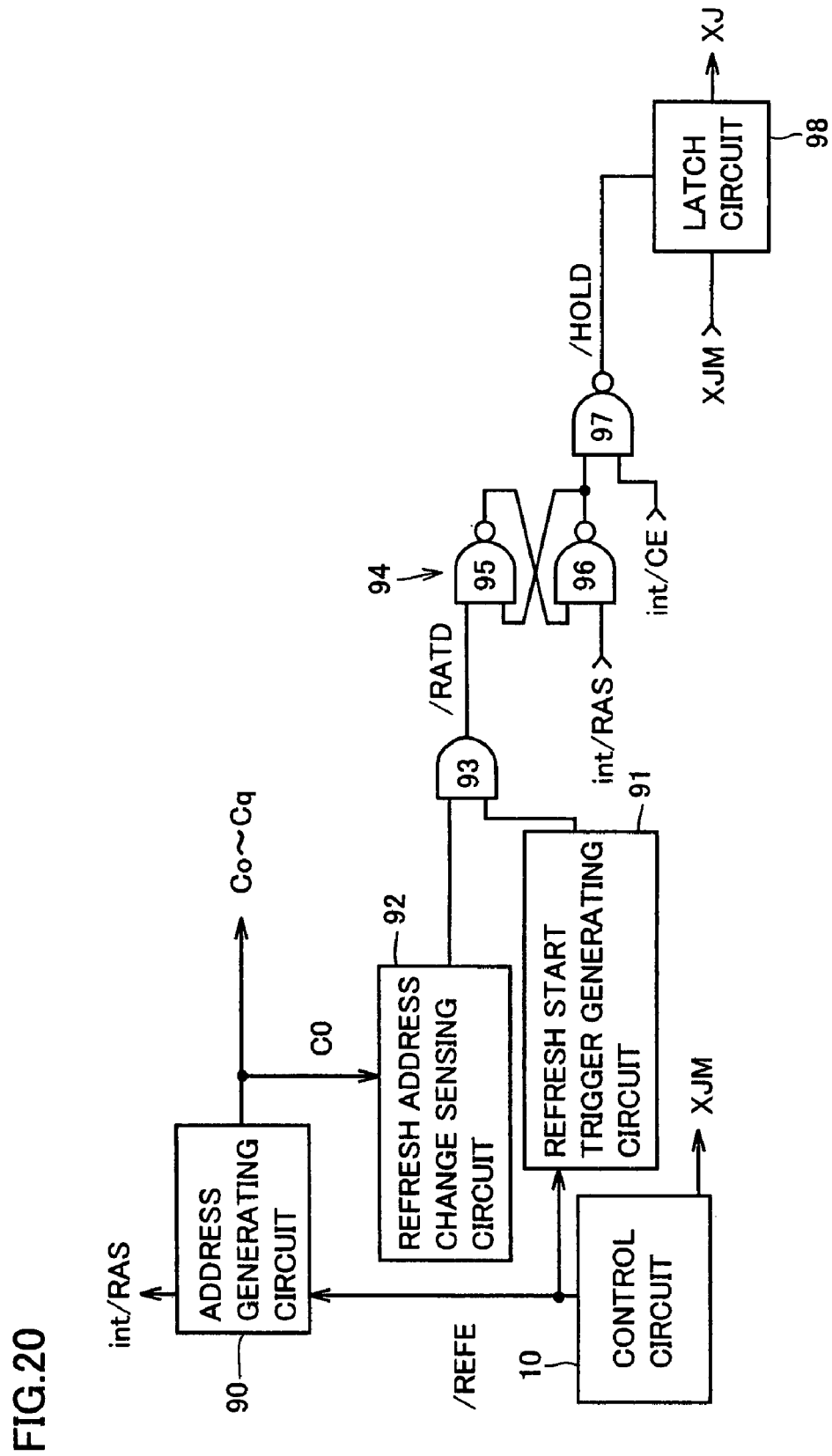
FIG. 20 is a circuit block diagram showing a portion of the row decoder of FIG. 18 related to the refresh operation.
Figure 21:
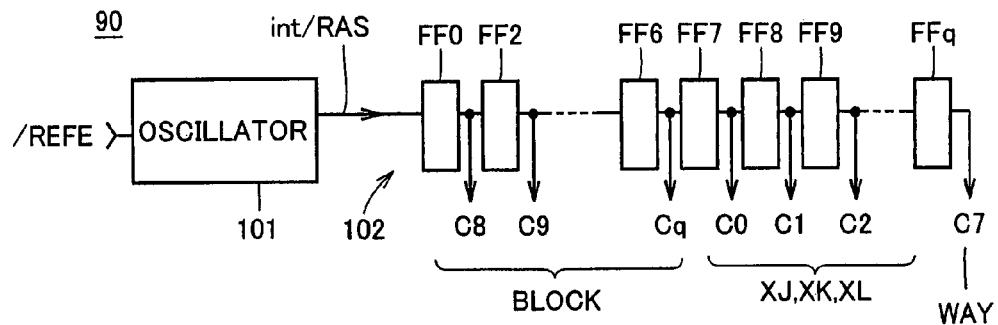
FIG. 21 is a block diagram showing a configuration of an address generating circuit shown in FIG. 20.

FIG. 20 is a circuit block diagram showing a portion of row decoder 14 related to the refresh operation. FIG. 21 is a circuit block diagram showing a configuration of an address generating circuit 90.

Referring to FIGS. 20 and 21, this complete hidden refresh function-equipped DRAM differs from the complete hidden refresh function-equipped DRAM of the first embodiment in that latch circuit 99 and AND gate 100 are removed, address signals C8-Cq relating to selection of block BK are output from flip-flops FF0-FF6 of address generating circuit 90, address signals C0-C6 relating to predecode signals XJ, XK and XL are output from flip-flops FF7 to FFq-1, and a signal C7 relating to selection of a way W is output from flip-flop FFq. Refresh address change sensing circuit 92 outputs a pulse signal in response to a change in address signal C0, i.e., an output of flip-flop FF7 of address generating circuit 90. A signal XJM is input to latch circuit 98, and an output signal of latch circuit 98 becomes signal XJ. Latch circuit 98 is provided corresponding to each of predecode signals XJ, XK, XL and Reset.

Figure 22:
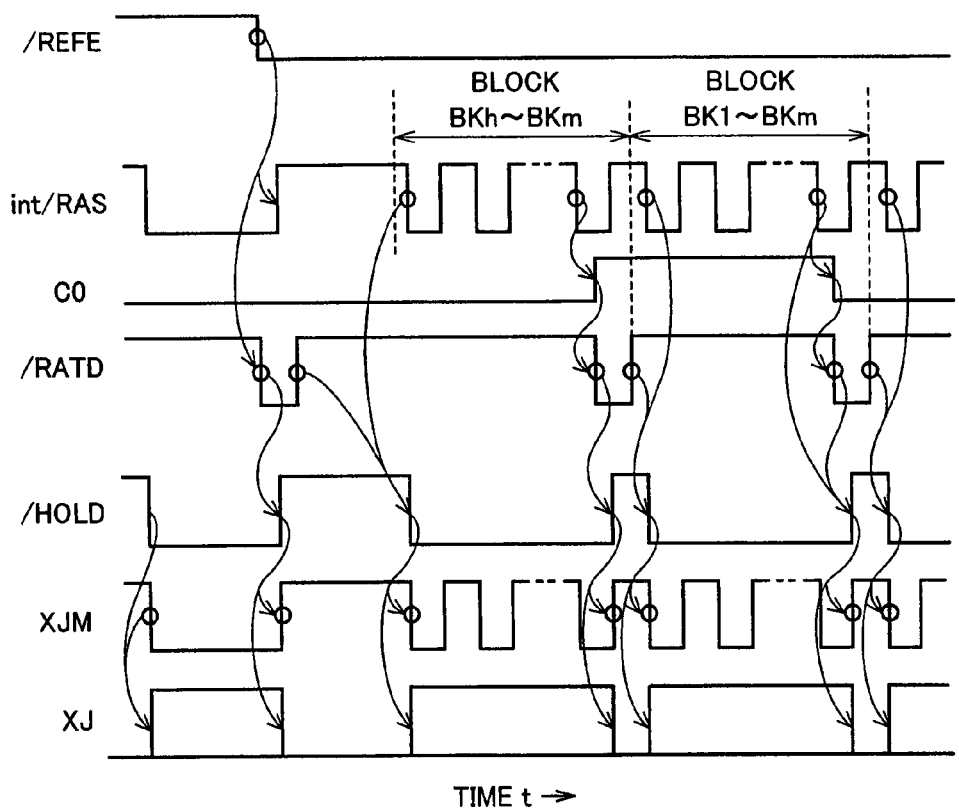
FIG. 22 is a timing chart illustrating an operation of the circuit portion shown in FIG. 20.

FIG. 22 is a timing chart illustrating an operation of the complete hidden refresh function-equipped DRAM shown in FIGS. 18-21. Signal /HOLD is generated in a similar manner as in the first embodiment. Signal XJM is latched by latch circuit 98 when signal /HOLD falls from an "H" level to an "L" level, and unlatched from latch circuit 98 when signal /HOLD rises from an "L" level to an "H" level. An output of latch circuit 98 becomes signal XJ. The same applies to other signals XK, XL and Reset.

While two word drivers 50 and 51 in each of blocks BK1-BKm are activated by predecode signals XJ, XK, XL and Reset, signals RX0-1 to RX0-m or signals RX1-1 to RX1-m attain an "H" level sequentially, and corresponding word lines WLs in respective blocks BK1 to BKm are selected sequentially, so that data refresh is carried out. At the time of start of refresh, while two word drivers 50 and 51 in each of blocks BK1 to BKm are activated by predecode signals XJ, XK, XL and Reset, signals RX0-h (h≧1) to RX0-m or signals RXh-1 to RX1-m attain an "H" level sequentially, and corresponding word lines WLs in respective blocks BKh to BKm are sequentially selected, so that data refresh is carried out. The other configuration and operation are identical to those of the first embodiment, and thus, description thereof will not be repeated here.

In the third embodiment, in the case where chip enable signal /CE is at an "H" level, i.e., in a standby mode, a lower address is assigned to each of memory blocks BK1 to BKm, and an upper address is assigned to each word line WL belonging to each of memory blocks BK1 to BKm, and further, predecode signals XJ, XK, XL and Reset will not be reset while corresponding word lines WLs in respective blocks BK1 to BKm are selected. Consequently, power consumption can be reduced compared to a conventional example in which predecode signals XJ, XK, XL and Reset are reset every time a single word line WL is selected.

Further, in the case where chip enable signal /CE is at an "L" level, i.e., in an active mode, predecode signals XJ, XK, XL and Reset are reset at each cycle, so that the write and read operations can be carried out quickly.

Fourth Embodiment

Figure 23:
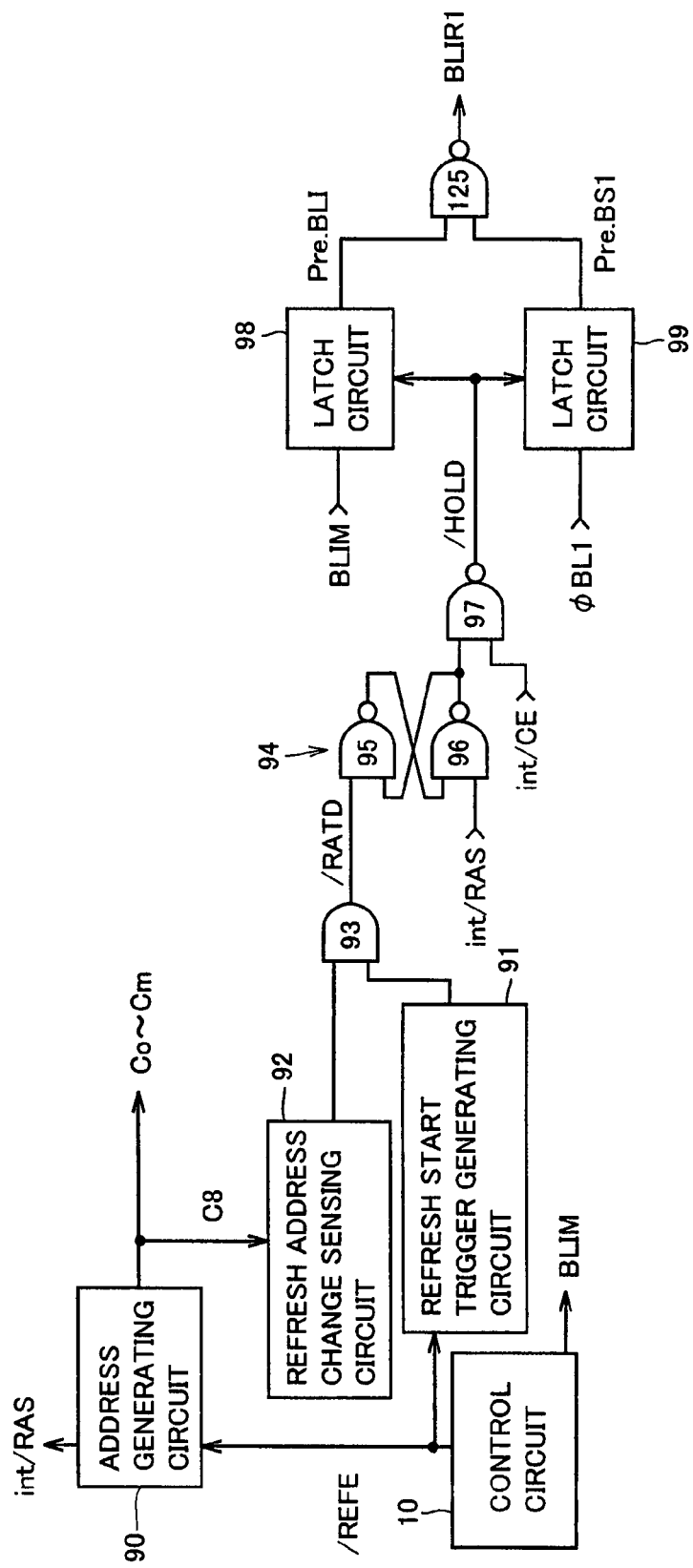
FIG. 23 is a circuit block diagram showing a portion of a row decoder related to the refresh operation in a complete hidden refresh function-equipped DRAM according to a fourth embodiment of the present invention.

FIG. 23 is a circuit block diagram showing a configuration of a main part of a complete hidden refresh function-equipped DRAM according to a fourth embodiment of the present invention.

Referring to FIG. 23, this complete hidden refresh function-equipped DRAM differs from the complete hidden refresh function-equipped DRAM of the first embodiment in that signals RXM, Pre.RX, φBL0-1, Pre.BS0-1, and RX0-1 are replaced with signals BLIM, Pre.BLI, φBL1, Pre.BS1, and BLIR1, respectively, and AND gate 100 is replaced with a NAND gate 125. Further, refresh address change sensing circuit 92 normally outputs a signal of an "H" level, and outputs a pulse of an "L" level in response to a change in an address signal C8, i.e., an output of flip-flop FF8 of address generating circuit 90. Signal BLIM is input to latch circuit 98, and a block selection signal φBL1 is input to latch circuit 99. NAND gate 125 receives an output signal Pre.BLI of latch circuit 98 and an output signal Pre.BS1 of latch circuit 99, and outputs a signal BLIR1. Latch circuit 99 and NAND gate 125 are provided corresponding to each of signals BLIL1, BLIR1, BLIL2, BLIR2, . . . . Signals φBL2, φBL1, φBL3, φBL2, . . .

for selecting a block to which corresponding signals BLIL1, BLIR1, BLIL2, BLIR2, ... are related, respectively, are input to latch circuit 99.

Figure 24:
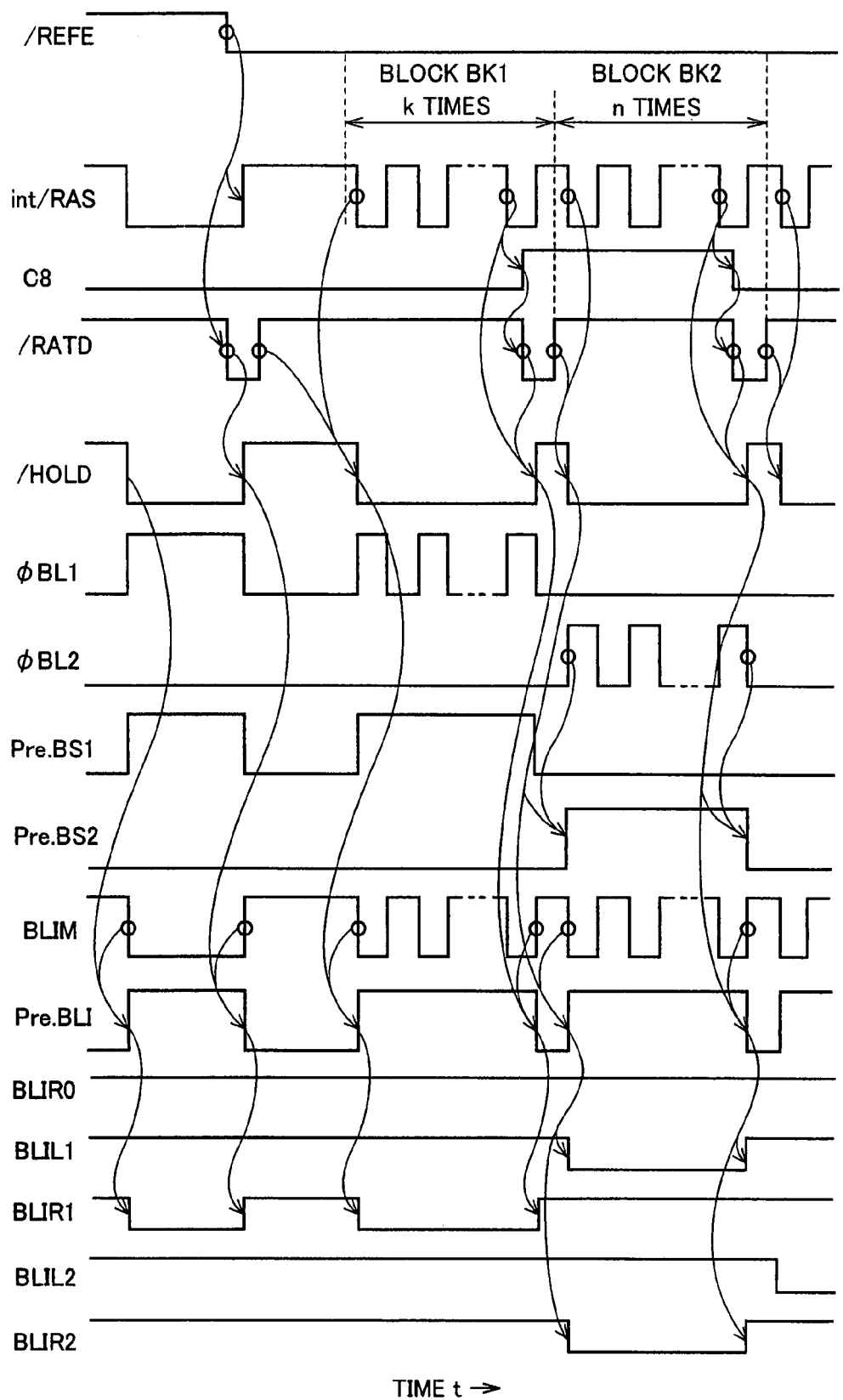
FIG. 24 is a timing chart illustrating an operation of the circuit portion shown in FIG. 23.

FIG. 24 is a timing chart illustrating an operation of the complete hidden refresh function-equipped DRAM shown in FIG. 23. A signal /HOLD is generated in a similar manner as in the first embodiment. Signals φBL1 and φBL2 are inverted signals of internal clock signal int/RAS for a period during which respective memory blocks BK1 and BK2 are selected. Signals Pre.BS1 and Pre.BS2 correspond respectively to signals φBL1 and φBL2 latched by latch circuit 99. Specifically, signals Pre.BS1 and Pre.BS2 correspond respectively to signals φBL1 and φBL2 of which portions that coincide with an inverted signal of internal clock signal int/RAS are made constant at an "H" level. Signal BLIM swings at approximately the same timing as internal clock signal int/RAS, and is output from control circuit 10. Signal Pre.BL1 corresponds to signal BLIM latched by latch circuit 98.

Signal BLIR0 is at an "H" level (boosted potential Vpp) at all times. Each of signals BLIL1 and BLIR2 is an inverted signal of a logical product signal of signals Pre.BS2 and Pre.BLI, and is normally at an "H" level (boosted potential Vpp) and attains an "L" level while memory block BK2 is selected. Signal BLIR1 is an inverted signal of a logical product signal of signals Pre.BS1 and Pre.BLI, and is normally at an "H" level (boosted potential Vpp) and attains an "L" level while block BK1 is selected.

While signal BLIR1 is at an "L" level, respective word lines WLs of block BK1 are sequentially selected, so that data refresh is carried out. While signals BLIL1 and BLIR2 are at an "L" level, respective word lines WLs of memory block BK2 are sequentially selected, so that data refresh is carried out. Then, memory block BK3 is selected, and a similar operation is carried out.

In the fourth embodiment, while one memory block BK (BK2, for example) is selected, a signal BLI (BLIL1 and BLIR2 in this case) will not be reset and held at an active level of an "L" level. Thus, power consumption is reduced compared to a conventional case where signal BLI is reset every time one word line WL is selected. Furthermore, since voltage Vpp of the amplitude of signal BLI is greater than power supply voltage VCC, the effect of reducing the power consumption by decreasing the number of times of reset of signal BLI is significant.

Power consumption can further be reduced if the fourth embodiment is combined with any of the first through third embodiments.

Fifth Embodiment

In the first through fourth embodiments described above, it has been configured such that a prescribed internal control signal is not reset at each cycle in response to rising of internal chip enable signal int/CE from an "L" level to an "H" level. If the time during which internal chip enable signal int/CE is at an "H" level is short, however, the standby mode and the active mode will be changed in a short period of time, which may lead to malfunction. Thus, in the fifth embodiment, in each of FIGS. 9, 16, 20 and 23, the signal for resetting flip-flop 94 is changed from signal int/CE to a signal int/CED.

Figure 25:
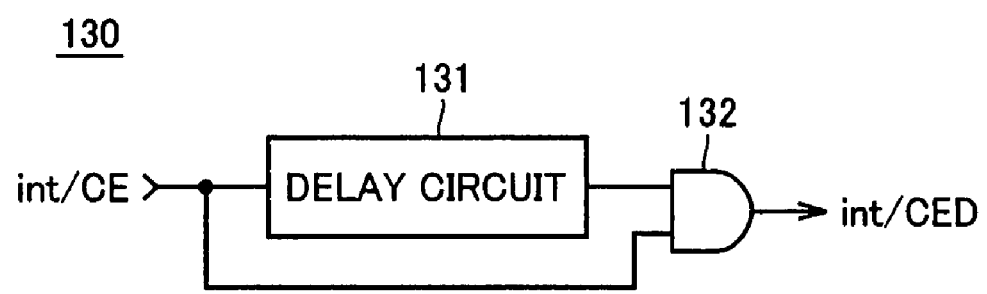
FIG. 25 is a circuit block diagram showing a main part of a complete hidden refresh function-equipped DRAM according to a fifth embodiment of the present invention.

FIG. 25 is a circuit block diagram showing a configuration of a signal generating circuit 130 that generates signal int/CED. In FIG. 25, signal generating circuit 130 includes a delay circuit 131 and an AND gate 132. AND gate 132 receives signal int/CE and a delayed version of signal int/CE that is delayed in delay circuit 131 by a prescribed time (1 μs, for example), and outputs their logical product signal as signal int/CED.

When signal int/CE is raised from an "L" level to an "H" level, signal int/CED is raised from an "L" level to an "H" level after a lapse of 1 μs. If signal int/CE is lowered from an "H" level to an "L" level before 1 μs passes from rising of signal int/CE from an "L" level to an "H" level, then signal int/CED is unchanged and maintains an "L" level. When signal int/CE is lowered from an "H" level to an "L" level, signal int/CED is immediately lowered from an "H" level to an "L" level. In this manner, when internal chip enable signal int/CE attains an "H" level only for a short period of time, the standby state is maintained, which prevents occurrence of malfunction.

Sixth Embodiment

Further, in the first through fourth embodiments described above, it has been configured not to reset row-related signals for refresh while internal chip enable signal int/CE is at an "H" level, and to reset the row-related signals for refresh while internal chip enable signal int/CE is at an "L" level. However, if internal chip enable signal int/CE is lowered from an "H" level to an "L" level while the row-related signals are active, determination as to whether the row-related signals are to be reset or not is uncertain, which may cause malfunction. Thus, in the sixth embodiment, a transfer gate 135 and an inverter 136 are added to the circuit shown in FIG. 6, for example.

Transfer gate 135 has one electrode receiving signal int/CE, and the other electrode connected to one input node of NAND gate 97. A row active signal /RA is directly input to a gate 135a of transfer gate 135 on the side of an N channel MOS transistor, and also input to a gate on the side of a P channel MOS transistor via inverter 136. Row active signal /RA is a signal indicating the period during which the row-related signals are activated, which is, e.g., an inverted signal of signal RX0-1.

Figure 26:
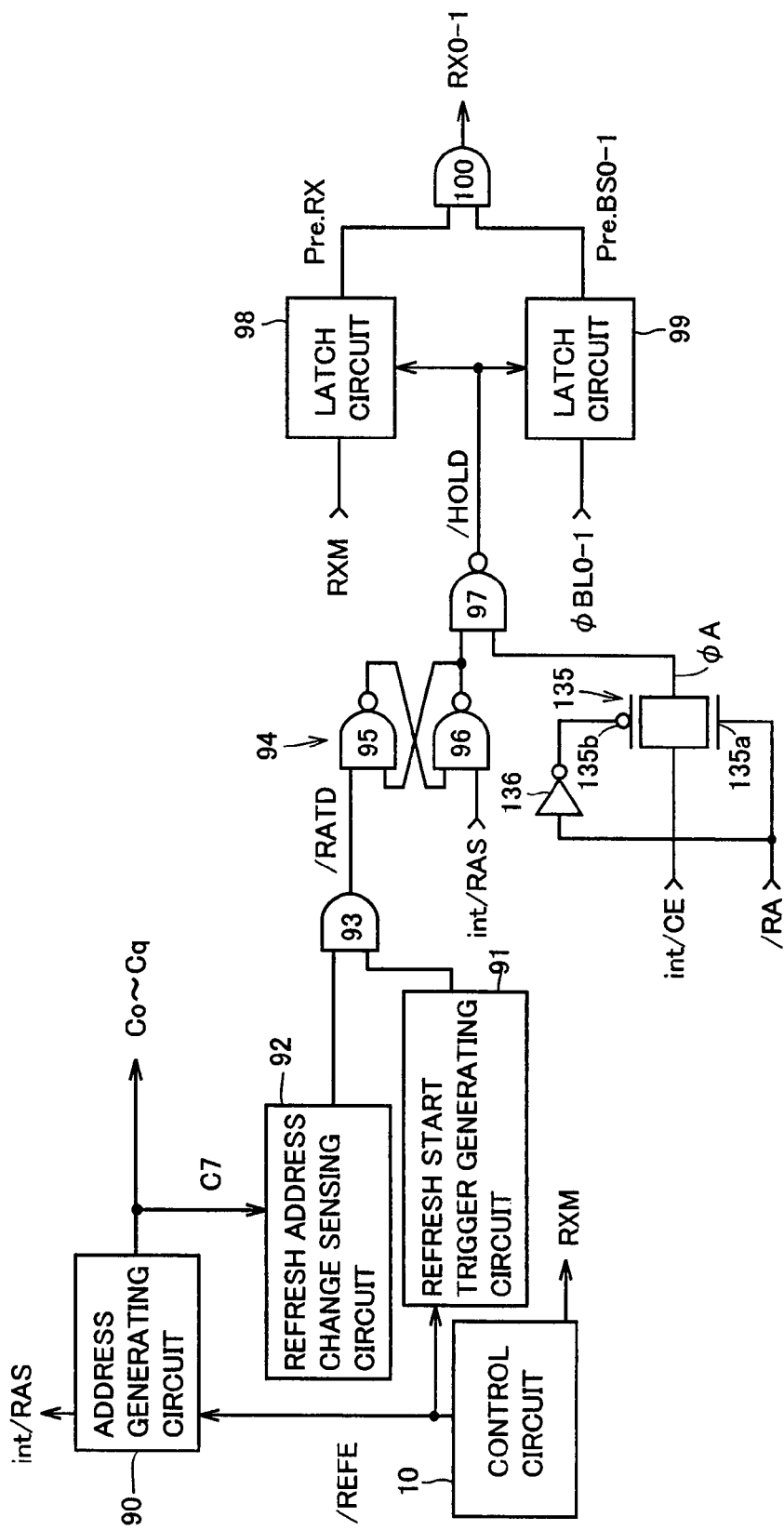
FIG. 26 is a circuit block diagram showing a main part of a complete hidden refresh function-equipped DRAM according to a sixth embodiment of the present invention.
Figure 27:
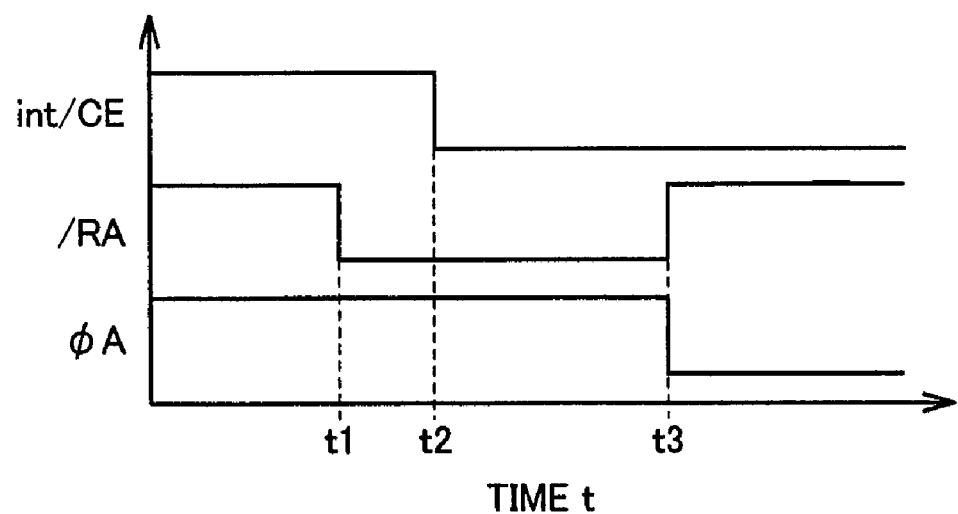
FIG. 27 is a timing chart illustrating an operation of the circuit portion shown in FIG. 26.

FIG. 27 is a timing chart illustrating an operation of the circuit shown in FIG. 26. In the initial state, signals int/CE, /RA are both at an "H" level. Since signal /RA is at an "H" level, transfer gate 135 is rendered conductive, and a signal φA appearing at the other electrode of transfer gate 135 is at an "H" level as is the signal int/CE. When signal /RA is pulled down to an "L" level at time t1, transfer gate 135 is rendered nonconductive. Next, when signal int/CE is pulled down to an "L" level at time t2, signal φA is maintained at an "H" level, since transfer gate 135 is nonconductive. Next, when signal /RA is raised to an "H" level at time t3, transfer gate 135 is rendered conductive, and signal φA is pulled down to an "L" level.

Accordingly, in the sixth embodiment, when internal chip enable signal int/CE is lowered from an "H" level to an "L" level (t2) during the period (t1 to t3) in which row active signal /RA is activated, the row-related signals are not reset immediately. The row-related signals are reset only after row active signal /RA is inactivated (t3). This can prevent malfunction.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a plurality of dynamic memory cells and operating as a static semiconductor memory device in terms of external functions, comprising:

a memory cell array having said plurality of dynamic memory cells arranged in rows and columns, a plurality of word lines provided corresponding respectively to said rows, and a plurality of bit line pairs provided corresponding respectively to said columns, said word lines being divided into a plurality of word line groups;

an instruction signal activating circuit having a timer circuit for outputting a cycle signal at a time interval necessary for refreshing data stored in said plurality of dynamic memory cells without being externally instructed and setting refresh instruction signal to an active level in response to said cycle signal, a chip enable signal, and read/write signal;

an oscillator for outputting a clock signal having a predetermined first period in response to said refresh instruction signal;

a group selection circuit operative in synchronization with said clock signal, and for sequentially selecting said plurality of word line groups at a second period that is a multiple of said first period, the group selection circuit setting a group selection signal indicating the selected word line group to an active level and then resetting the same to an inactive level at said first period in a active mode, and setting said group selection signal to an active level and then resetting the same to an inactive level at said second period in a standby mode, wherein the mode changes between the active mode and the standby mode in response to said chip enable signal;

a word line selection circuit for sequentially selecting a plurality of word lines belonging to the word line group selected by said group selection circuit at said first period, the word line selection circuit setting a word line selection signal indicating the selected word line to an active level and then resetting the same to an inactive level at said first period;

a word driver provided corresponding to each word line, and for setting the corresponding word line to a selected level when both of the corresponding group selection signal and the corresponding word line selection signal are set to the active level; and a refresh executing circuit for carrying out data refresh of each dynamic memory cell corresponding to the word line set to the selected level by said word driver.

2. The semiconductor memory device according to claim 1, wherein said group selection circuit includes a latch circuit for changing latch holding time in response to said chip enable signal.

* * * * *